(12) United States Patent
Runge et al.

(10) Patent No.: US 10,937,966 B2
(45) Date of Patent: Mar. 2, 2021

(54) METHOD FOR PREPARING AN ORGANIC SEMICONDUCTOR LAYER AND AN ORGANIC ELECTRONIC DEVICE

(71) Applicant: Novaled GmbH, Dresden (DE)

(72) Inventors: Steffen Runge, Dresden (DE); Carsten Rothe, Dresden (DE); Julien Frey, Dresden (DE); Uwe Gölfert, Dresden (DE)

(73) Assignee: Novaled GmbH, Dresden (DE)

( * ) Notice: Subject to any disclaimer, the term of this patent is extended or adjusted under 35 U.S.C. 154(b) by 50 days.

(21) Appl. No.: 16/329,018

(22) PCT Filed: Aug. 30, 2017

(86) PCT No.: PCT/EP2017/071709
§ 371 (c)(1),
(2) Date: Feb. 27, 2019

(87) PCT Pub. No.: WO2018/041864
PCT Pub. Date: Mar. 8, 2018

(65) Prior Publication Data
US 2019/0207116 A1    Jul. 4, 2019

(30) Foreign Application Priority Data
Aug. 30, 2016   (EP) .................................... 16186262

(51) Int. Cl.
*H01L 51/00*    (2006.01)
*H01L 51/50*    (2006.01)
(Continued)

(52) U.S. Cl.
CPC ........ *H01L 51/0052* (2013.01); *H01L 51/001* (2013.01); *H01L 51/008* (2013.01);
(Continued)

(58) Field of Classification Search
USPC ............................................... 427/58, 255.28
See application file for complete search history.

(56) References Cited

U.S. PATENT DOCUMENTS

| | | | |
|---|---|---|---|
| 6,110,236 A * | 8/2000 | Tsang | H01M 4/626 29/623.5 |
| 7,252,859 B2 * | 8/2007 | Ng | C23C 14/12 427/248.1 |

(Continued)

OTHER PUBLICATIONS

PCT International Search Report and Written Opinion for PCT Application No. PCT/EP2017/071709 dated Nov. 7, 2017 (8 pages).
(Continued)

*Primary Examiner* — Brian K Talbot
(74) *Attorney, Agent, or Firm* — Eversheds Sutherland (US) LLP

(57) ABSTRACT

The present invention relates to a method for preparing an organic semiconductor layer in a vacuum chamber at a pressure of $10^{-5}$ to $10^{-9}$ mbar comprising a step of sublimating a composition from a single vacuum thermal evaporation source arranged in the vacuum chamber, wherein the composition comprises a physical mixture of (a) a first organic aromatic matrix compound having a molecular weight $\geq 400$ and $\leq 1{,}000$: and (b) a first alkali organic complex having a molecular weight of $\geq 100$ and $\leq 400$.

15 Claims, 5 Drawing Sheets

(51) Int. Cl.
*H01L 51/56* (2006.01)
*C23C 14/12* (2006.01)
*C23C 14/24* (2006.01)
*C23C 14/00* (2006.01)

(52) U.S. Cl.
CPC ...... *H01L 51/0058* (2013.01); *H01L 51/0071* (2013.01); *H01L 51/0072* (2013.01); *H01L 51/0077* (2013.01); *H01L 51/5076* (2013.01); *H01L 51/56* (2013.01); *C23C 14/00* (2013.01); *C23C 14/12* (2013.01); *C23C 14/243* (2013.01); *H01L 51/0085* (2013.01); *H01L 51/5092* (2013.01)

(56) References Cited

U.S. PATENT DOCUMENTS

| | | | |
|---|---|---|---|
| 10,297,762 B2* | 5/2019 | Zeng | C07D 251/24 |
| 10,381,569 B2* | 8/2019 | Xia | H01L 51/0071 |
| 2003/0008071 A1* | 1/2003 | Van Slyke | H01L 51/001 427/255.28 |
| 2004/0142098 A1* | 7/2004 | Ghosh | H01L 51/001 427/68 |
| 2011/0260151 A1* | 10/2011 | Hashimoto | H05B 33/14 257/40 |
| 2013/0320307 A1* | 12/2013 | Birnstock | H01L 51/5048 257/40 |
| 2016/0099422 A1* | 4/2016 | Zeng | H01L 51/5096 257/40 |

OTHER PUBLICATIONS

European Search Report for EP Application No. 16186262 dated Feb. 6, 2017 (5 pages).

Pu et al., "Lithium Phenolate Complexes for an Electron Injection Layer in Organic Light-Emitting Diodes," Organic Electronics, 2009, 10:228-232.

* cited by examiner

METHOD FOR PREPARING AN ORGANIC SEMICONDUCTOR LAYER AND AN ORGANIC ELECTRONIC DEVICE

The present invention relates to a method for preparing an organic semiconductor layer comprising a step of sublimating a composition from a single vacuum thermal evaporation source wherein the composition comprises a physical mixture of a first organic aromatic matrix compound and a first alkali organic complex and to a method for preparing an organic electronic device comprising the organic semiconductor layer obtainable by this method.

BACKGROUND

Organic semiconductor layers comprising organic aromatic matrix compounds and alkali organic complexes are used in organic electronics as charge transport and charge injection layers, in particular for organic light emitting diodes (OLEDs).

Organic light emitting diodes, which are self-emitting devices, have a wide viewing angle, excellent contrast, quick response, high brightness, excellent driving voltage characteristics, and color reproduction. A typical OLED includes an anode electrode, a hole injection layer (HIL), a hole transport layer (HTL), an emission layer (EML), an electron transport layer (ETL), an electron injection layer (EIL) and a cathode electrode, which are sequentially stacked on a substrate. In this regard, the HIL, the HTL, the EML, the ETL and the EIL are thin films formed from organic compounds.

When a voltage is applied to the anode electrode and the cathode electrode, holes injected from the anode electrode move to the EML, via the HIL and HTL, and electrons injected from the cathode electrode move to the EML, via the EIL and the ETL. The holes and electrons recombine in the EML to generate excitons.

Semiconductor layers comprising more than one compound comprised in organic electronic devices of the art are usually deposited from at least two separate vacuum thermal evaporation (VTE) sources. Physical mixtures of organic aromatic matrix compounds may be evaporated from one source if the evaporation temperature is closely matched. Typically, these compounds are evaporated from the melt as the melting point is lower than the rate onset temperature for evaporation in vacuum. Organic aromatic matrix compounds and alkali organic complexes are, according to the prior art, evaporated from at least two separate VTE sources as otherwise degradation of the organic aromatic matrix compound and/or alkali organic complex may occur if the mixture is heated in a single source. During mass production of semiconductor layers, typically the VTE sources move back and forth under the substrate which is to be coated. If two compounds are evaporated from separate sources, the lateral uniformity may be poor, as first one and then the other compound is deposited. This may lead to reduced performance and/or stability.

US2016/0099422 A1 discloses a composition formed of a mixture of a first compound a a second compound wherein the first compound has a different chemical structure than the second compound. The first compound and the second compound are both organic compounds. At least one of the first compound has an evaporation temperature T1 and the second compound has a evaporation temperature T2 where both T1 and T2 are between 100 to 400° C. and the absolute value of T1-T2 is less than 20° C. The first compound has a concentration C1 in said mixture and the concentration C2 in a film formed by evaporating said mixture in a high vacuum deposition tool with a chamber base pressure between $1 \times 10^{-6}$ Torr, at a 2 Å/sec deposition rate on a surface positioned at a predefined distance away from the mixture being evaporated; and wherein absolutely value of (C1−C2)/C1 is less than 5%.

Pu et al., Organic Electronics, 2009, 10, 228-232 discloses lithium phenolate complexes for an electron injection layer in organic light-emitting diodes.

SUMMARY

It is therefore the object of the present invention to provide a method for preparing an organic semiconductor layers overcoming drawbacks of the prior art, in particular reducing the number of VTE sources required and improving the lateral uniformity of the organic semiconductor layer.

This object is achieved by a method for preparing an organic semiconductor layer in a vacuum chamber at a pressure of $10^{-5}$ to $10^{-9}$ mbar comprising a step of sublimating a composition from a single vacuum thermal evaporation source arranged in the vacuum chamber, wherein the composition comprises a physical mixture of
(a) a first organic aromatic matrix compound having a molecular weight $\geq 400$ and $\leq 1{,}000$; and
(b) a first alkali organic complex having a molecular weight of a $\geq 100$ and $\leq 400$.

The physical mixture may be prepared by mixing the first organic aromatic matrix compound and the first alkali organic complex in their solid state, preferably as powders. To achieve a homogenous mixture, the physical mixture may be prepared through grinding.

The term "sublimating" shall be understood to mean transfer of the first organic aromatic matrix compound and first alkali organic complex from solid state into the gas phase. During heating, the composition may form a glass. A glass in this regard is a non-crystalline amorphous solid, particularly a solid having a non-crystalline structure at the atomic scale and exhibiting a glass transition when heated. However, the composition does not melt.

The composition is transferred from the solid phase into the gas phase through heating in a vacuum thermal evaporation (VTE) source. The VTE source comprises a receptacle for the composition, a heating element to heat the receptacle and at least one thermocouple to determine the temperature of the receptacle. The receptacle may be a crucible. The receptacle consists of inert material, for example $Al_2O_3$ or Ti. Additionally, the VTE source may comprise a cover with openings for releasing the composition in the gas phase into the vacuum chamber, for example nozzles. The cover may be heated to reduce risk of clogging of the openings or nozzles.

The vacuum thermal evaporation source may also be described as VTE source, thermal evaporation source, evaporator deposition source, nozzle source, shower head source, VTE cell, thermal evaporation cell, evaporation cell or sublimation cell. The vacuum thermal evaporation source is arranged in the vacuum chamber.

In the context of the present invention, the term "vacuum chamber" means the location wherein the transfer of the composition from the VTE source into the gas phase takes place. Subsequent deposition of the composition on a solid support also takes place in the vacuum chamber. The vacuum chamber is made from metal or other mechanically stable material and can be evacuated to generate a vacuum in the vacuum chamber. The vacuum chamber may also be described as deposition chamber, process chamber, sublimation chamber or evaporation chamber.

The molecular weight is calculated based on the chemical formula of s single unit (also called monomer) of the first organic aromatic matrix compound or first alkali organic complex and measured in gram per mol (g/mol). The term single unit particularly applies if the first organic aromatic matrix compound or the first alkali organic complex is in the form of a dimer or a trimer. If no dimer or trimer (or oligo-/polymer) is formed, the molecular weight of the single unit is the same as that of the first organic aromatic matrix compound or the first alkali organic complex. If the molecular weight is selected in this range, the compound can be transferred into the gas phase at a temperature and rate which are suitable for mass production.

The vacuum in the vacuum chamber is selected in the range between about $10^{-5}$ and about $10^{t9}$ mbar, also preferred between about $10^{-7}$ and about $10^{-8}$ mbar. Sublimation of the composition can be well achieved at this pressure.

Surprisingly it was found that the problem in the prior art can be solved by, subliming the composition from a single VTE source. It was found that negligible degradation of the composition occurred during the timeframe suitable for mass production (several hours to several days of continuous production), if the composition did not melt. Thereby, the organic semiconductor layer of the present invention can be prepared while maintaining a stable ratio over time of the first organic aromatic matrix compound to first alkali organic complex. Additionally, the risk of contamination of the organic semiconductor layer through volatile decomposition products is minimized.

When a physical mixture of first organic aromatic matrix compound and first alkali organic complex is sublimed from one VTE source (i.e. from a single VTE source), one VTE source is freed up which can be used for evaporation and/or sublimation of a second matrix compound, a second alkali organic complex or a second composition according to invention. This constitutes a significant technical benefit, as the space inside a vacuum chamber is severely limited. On the other hand, it is desirable to be able to evaporate as many compounds as physically possible as thereby fine-tuning of the performance of an organic electronic device can be achieved. Additionally, improved lateral homogeneity of the organic semiconductor layer may be achieved, as both components are evaporated at the same time from a single VTE source. Improved lateral homogeneity may result in improved performance and stability, in particular in mass production. Furthermore, a higher TACT time may be achieved as the organic semiconductor layer may be deposited at a faster rate.

The term "single vacuum thermal evaporation source" as used herein shall not be construed in a way that only one single vacuum thermal evaporation source may be arranged within the vacuum chamber. Rather, it might be provided that more than one single vacuum thermal evaporation sources are used in parallel, each of which comprises a mixture of inventive compounds. The term "single" in this regard should rather be understood in that, according to the inventive concept, a physical mixture of at least two of the inventive compounds is evaporated from only one (single) evaporation source.

According to another aspect of the present invention, a method is provided for preparing an organic semiconductor layer in a vacuum chamber at a pressure of $10^{-5}$ to $10^{-9}$ mbar comprising a first step of sublimating a composition from a single vacuum thermal evaporation source arranged in the vacuum chamber, wherein the composition comprises a physical mixture of
(a) a first organic aromatic matrix compound having a molecular weight $\geq 400$ and $\leq 1,000$; and
(b) a first alkali organic complex having a molecular weight of $\geq 100$ and $\leq 400$; and
a second step of depositing the composition on a solid support in the vacuum chamber to form the organic semiconductor layer.

The solid support may be selected from a substrate, a wire, an anode electrode or a cathode electrode. The solid support is arranged in the same vacuum chamber as the VTE source. Preferably the solid support is arranged above the VTE source.

The VTE source may move back and forth or rotate underneath the substrate. This process is described for example in KR20150080213. Alternatively, the VTE source may be stationary and the substrate may move above the source.

According to another aspect of the present invention, a method is provided for preparing an organic semiconductor layer in a vacuum chamber at a pressure of $10^{-5}$ to $10^{-9}$ mbar comprising a step of sublimating a composition from a single vacuum thermal evaporation source arranged in the vacuum chamber, wherein the composition consists of a physical mixture of
(a) a first organic aromatic matrix compound having a molecular weight $\geq 400$ and $\leq 1,000$; and
(b) a first alkali organic complex having a molecular weight of $\geq 100$ and $\leq 400$.

According to another aspect of the present invention, a method is provided for preparing in a vacuum chamber at a pressure of $10^{-5}$ to $10^{-9}$ mbar an organic semiconductor layer comprising a first step of sublimating a composition from a single vacuum thermal evaporation source arranged in the vacuum chamber, wherein the composition consists of a physical mixture of
(a) a first organic aromatic matrix compound having a molecular weight $\geq 400$ and $\leq 1,000$; and
(b) a first alkali organic complex having a molecular weight of $\geq 100$ and $\leq 400$; and
a second step of depositing the composition on a solid support in the vacuum chamber to form the organic semiconductor layer.

Preferably the second step is performed directly after the first step.

In another embodiment, the first organic aromatic matrix compound has a melting point of $\geq 200$ and $\leq 450°$ C. and/or a glass transition temperature of $\geq 80$ and $\leq 250°$ C., preferably a melting point of $\geq 250$ and $\leq 430°$ C. and/or a glass transition temperature of $\geq 90$ and $\leq 230°$ C.

When the first organic aromatic matrix compound is selected in this range, sublimation of the composition can be very well achieved.

In another embodiment, the first alkali organic complex has a melting point of $\geq 250$ and $\leq 450°$ C. and/or a glass transition temperature of $\geq 100$ and $\leq 250°$ C.

When the first alkali organic complex is selected in this range, sublimation of the composition can be very well achieved.

In a further embodiment, the first organic aromatic matrix compound has a melting point of $\geq 200$ and $\leq 450°$ C. and/or a glass transition temperature of $\geq 80$ and $\leq 250°$ C., preferably a melting point of $\geq 250$ and $\leq 430°$ C. and/or a glass transition temperature of $\geq 90$ and $\leq 230°$ C.; and the first alkali organic complex has a melting point of ≥250 and ≤450° C. and/or a glass transition temperature of ≥100 and ≤250° C.

In a further embodiment, the composition has a melting point of ≥200 and ≤450° C., preferably a melting point of ≥225 and ≤400° C., also preferred of ≥225 and ≤350° C.

When the composition is selected in this range, sublimation of the composition can be very well achieved.

According to another aspect of the present invention, a method is provided, wherein the rate onset temperature for sublimating the composition of the present invention at a pressure of $10^{-5}$ to $10^{-9}$ mbar is at least 10° C. lower than the melting point of the composition of the present invention.

Preferably the rate onset temperature of the composition is at least 20° C. lower than the melting point of the composition, even more preferred at least 30° C.

Under these conditions, the best results with respect to the sublimation have been observed.

According to another aspect of the present invention, a method is provided for preparing an organic semiconductor layer in a vacuum chamber at a pressure of $10^{-5}$ to $10^{-9}$ mbar comprising a step of sublimating a composition from a single vacuum thermal evaporation source arranged in the vacuum chamber, wherein the composition comprises a physical mixture of
(a) a first organic aromatic matrix compound having a molecular weight ≥400 and ≤1,000 and the rate onset temperature for sublimating the first organic aromatic matrix compound at a pressure of $10^{-5}$ to $10^{-9}$ mbar in the vacuum chamber is at least 10° C. lower than the melting point of the composition, preferably at least 20° C. lower, more preferably at least 30° C. lower; and
(b) a first alkali organic complex having a molecular weight of ≥100 and ≤400.

According to another aspect of the present invention, a method is provided for preparing an organic semiconductor layer in a vacuum chamber at a pressure of $10^{-5}$ to $10^{-9}$ mbar comprising a step of sublimating a composition from a single vacuum thermal evaporation source arranged in the vacuum chamber, wherein the composition comprises a physical mixture of
(a) a first organic aromatic matrix compound having a molecular weight ≥400 and ≤1,000 and the rate onset temperature for sublimating the first organic aromatic matrix compound at a pressure of $10^{-5}$ to $10^{-9}$ mbar in the vacuum chamber is at least 10° C. lower than the melting point of the composition, preferably at least 20° C. lower, more preferably at least 30° C. lower; and
(b) a first alkali organic complex having a molecular weight of ≥100 and ≤400; and wherein the melting point of the composition is ≥200 and ≤450° C., preferably ≥225 and ≤400° C., also preferred ≥225 and ≤350° C.

Under these conditions, the best results with respect to the sublimation have been observed.

According to another aspect of the present invention, a method is provided, wherein the temperature at which 0.5% weight loss occurs of the composition is at least 120° C. higher than the melting point of the composition of the present invention. The weight loss is determined by thermogravimetric analysis (TGA) at atmospheric pressure. Under these conditions, the best results with respect to the sublimation have been observed.

According to another aspect of the present invention, a method is provided, wherein the first organic aromatic matrix compound is selected from the group consisting of phosphine, phosphepine, phosphine oxide, phosphepine oxide, phenanthroline, benzimidazole, benzo[k]fluoranthene, pyrene, anthracene, fluorene, spiro(bifluorene), phenanthrene, perylene, triptycene, spiro[fluorene-9,9'-xanthene], coronene, triphenylene, xanthene, benzofurane, dibenzofurane, dinaphthofurane, acridine, benzo[c]acridine, dibenzo[c,h]acridine, dibenzo[a,j]acridine, triazine, pyridine, pyrimidine, carbazole, thienopyrimidine, dithienothiophene, benzothienopyrimidine, benzothienopyrimidine, and triaryl borane.

In another embodiment, the first organic aromatic matrix compound contains zero or one heteroaryl group.

Surprisingly, it was found that sublimation can be achieved when the first organic aromatic matrix compound contains at most one heteroaryl group. When the first organic aromatic matrix compound contains more than one heteroaryl group the rate onset temperature for evaporation of the composition is in general too high. This may result in melting of the composition before evaporation is observed.

According to another aspect of the present invention, a method is provided, wherein the first organic aromatic matrix compound has a dipole moment of >2.5 Debye and ≤10 Debye, preferably between >2.5 Debye and ≤5 Debye.

The dipole moment $|\vec{\mu}|$ of a molecule containing N atoms is given by:

$$\vec{\mu} = \sum_i^N q_i \vec{r}_i$$

$$|\vec{\mu}| = \sqrt{\mu_x^2 + \mu_y^2 + \mu_z^2}$$

wherein $q_i$ and $\vec{r}_i$ are the partial charge and position of atom i in the molecule.

The dipole moment is determined by a semi-empirical molecular orbital method.

The partial charges and atomic positions are obtained using either the DFT functional of Becke and Perdew BP with a def-SV(P) basis or the hybrid functional B3LYP with a def2-TZVP basis set as implemented in the program package TURBOMOLE V6.5. If more than one conformation is viable, the conformation with the lowest total energy is selected to determine the dipole moment.

When the dipole moment of the first organic aromatic matrix compound is selected >2.5 Debye and <10 Debye, the first organic aromatic matrix compound can also be described as polar matrix compound.

If the first organic aromatic matrix compound has a dipole moment >2.5 and <10 Debye, it may be described by one of the following symmetry groups: $C_1$, $C_n$, $C_{inv}$, or $C_s$.

A respective dipole moment of the first organic aromatic matrix compound was found to be advantageous with regard to the sublimation properties when being used in the inventive method. In another embodiment, the first organic aromatic matrix compound is selected from the group consisting of phosphine oxide, phosphepine oxide, phenanthroline and benzimidazole. The dipole moment of these compounds is in the range of >2.5 and ≤5 Debye.

When the first organic matrix compound is selected in this range, particularly good performance is achieved.

In another embodiment, the first organic aromatic matrix compound is selected from a compound comprising a phosphine oxide, or phosphepine oxide group (wherein the P atom and the O atom are connected via a double bond). Particularly good performance is achieved.

In another embodiment, the first organic aromatic matrix compound is selected from a compound comprising a phosphepine oxide group.

Excellent performance may be obtained when the first organic aromatic matrix compound is selected from the formulas in Table 1.

TABLE 1

First organic aromatic matrix compounds which may be suitable used

| Referred to as: | Structure |
|---|---|
| MX1 | 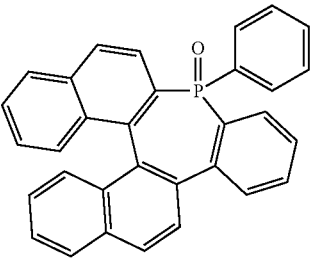 [SMILES: O=P1(c2ccccc2)c2ccccc2-c2ccc3ccccc3c2-c2c1ccc1ccccc21] |
| MX2 | 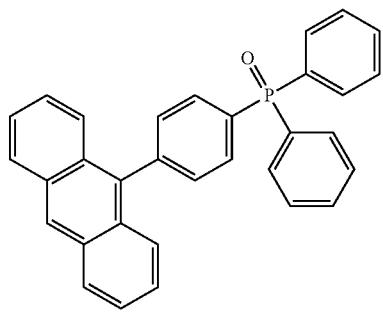 [SMILES: O=P(c1ccccc1)(c1ccccc1)c1ccc(-c2c3ccccc3cc3ccccc23)cc1] |
| MX3 | 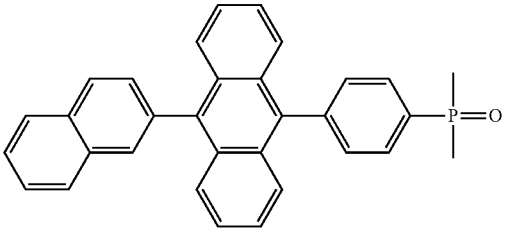 [SMILES: CP(C)(=O)c1ccc(-c2c3ccccc3c(-c3ccc4ccccc4c3)c3ccccc23)cc1] |
| MX4 | 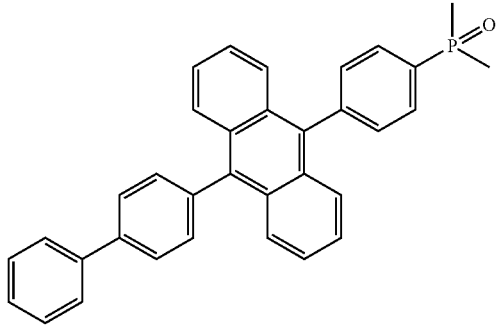 [SMILES: CP(C)(=O)c1ccc(-c2c3ccccc3c(-c3ccc(-c4ccccc4)cc3)c3ccccc23)cc1] |
| MX5 | 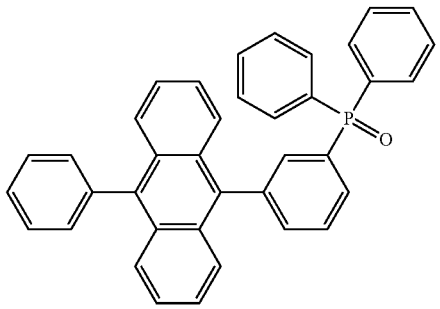 [SMILES: O=P(c1ccccc1)(c1ccccc1)c1cccc(-c2c3ccccc3c(-c3ccccc3)c3ccccc23)c1] |

TABLE 1-continued

First organic aromatic matrix compounds which may be suitable used

| Referred to as: | Structure |
| --- | --- |
| MX6 | 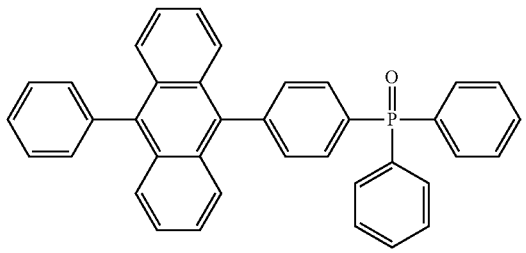 [SMILES: O=P(c1ccccc1)(c1ccccc1)c1ccc(-c2c3ccccc3c(-c3ccccc3)c3ccccc23)cc1] |
| MX7 | 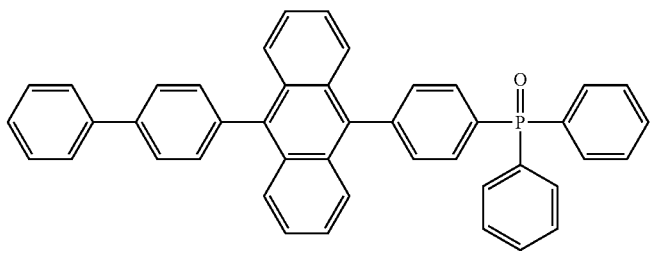 [SMILES: O=P(c1ccccc1)(c1ccccc1)c1ccc(-c2c3ccccc3c(-c3ccc(-c4ccccc4)cc3)c3ccccc23)cc1] |
| MX8 | 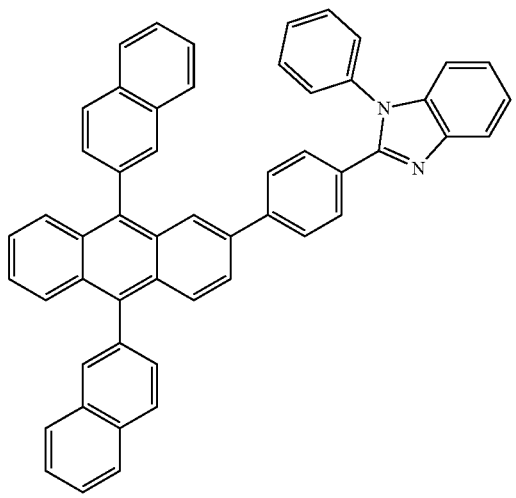 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] |

According to another aspect of the present invention, a method is provided, wherein the first organic aromatic matrix compound has a dipole moment of ≥0 Debye and ≤2.5 Debye.

When the dipole moment of the first organic aromatic matrix compound is selected ≥0 Debye and ≤2.5 Debye, the first organic aromatic matrix compound can also be described as non-polar matrix compound.

When a matrix compound has a dipole moment between 0 and 2.5 Debye, the matrix compound may contain a center of inversion I, a horizontal mirror plane, more than one $C_n$ axis (n>1), and/or n $C_2$ perpendicular to $C_n$.

In a further embodiment, the first organic aromatic matrix compound is selected from the group consisting of benzo[k]fluoranthene, pyrene, anthracene, fluorene, spiro(bifluorene), phenanthrene, perylene, triptycene, spiro[fluorene-9,9'-xanthene], coronene, triphenylene, xanthene, benzofurane, dibenzofurane, dinaphthofurane, acridine, benzo[c]acridine, dibenzo[c,h]acridine, dibenzo[a,j]acridine, triazine, pyridine, pyrimidine, carbazole, thienopyrimidine, dithienothiophene, benzothienopyrimidine, benzothienopyrimidine, triaryl borane, phosphine and phosphepine. The dipole moment of these compounds is in the range of of ≥0 Debye and ≤2.5 Debye.

In a further preferred embodiment, the first organic aromatic matrix compound comprises a dibenzo[c,h]acridine compound of formula (II)

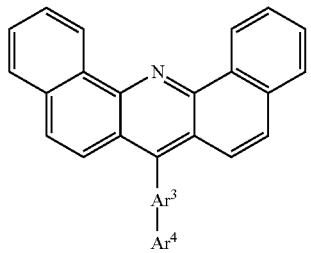

(II)

and/or a dibenzo[a,j]acridine compound of formula (III)

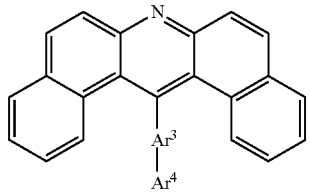

(III)

and/or a benzo[c]acridine compound of formula (IV)

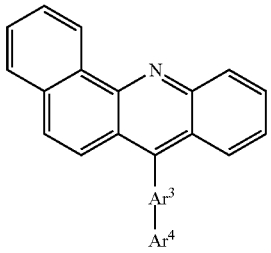

(IV)

wherein $Ar^3$ is independently selected from $C_6$-$C_{20}$ arylene, preferably phenylene, biphenylene, or fluorenylene;

$Ar^4$ is independently selected from unsubstituted or substituted $C_6$-$C_{40}$ aryl, preferably phenyl, naphthyl, anthranyl, pyrenyl, or phenanthryl;

and in case that $Ar^4$ is substituted, the one or more substituents may be independently selected from the group consisting of $C_1$-$C_{12}$ alkyl and $C_1$-$C_{12}$ heteroalkyl, wherein $C_1$-$C_5$ alkyl is preferred.

Suitable dibenzo[c,h]acridine compounds are disclosed in EP 2 395 571. Suitable dibenzo[a,j]acridine are disclosed in EP 2 312 663. Suitable benzo[c]acridine compounds are disclosed in WO 2015/083948.

In a further embodiment, it is preferred that the first organic aromatic matrix compound comprises a dibenzo[c,h]acridine compound substituted with $C_6$-$C_{40}$ aryl, $C_5$-$C_{40}$ heteroaryl and/or $C_1$-$C_{12}$ alkyl groups, preferably 7-(naphthalen-2-yl)dibenzo[c,h]acridine, 7-(3-(pyren-1-yl)phenyl)dibenzo[c,h]acridine, 7-(3-(pyridin-4-yl)phenyl)dibenzo[c,h]acridine.

In a further embodiment, it is preferred that the first organic aromatic matrix compound comprises a dibenzo[a,j]acridine compound substituted with $C_6$-$C_{40}$ aryl, $C_5$-$C_{40}$ heteroaryl and/or $C_1$-$C_{12}$ alkyl groups, preferably 14-(3-(pyren-1-yl)phenyl)dibenzo[a,j]acridine.

In a further embodiment, it is preferred that the first organic aromatic matrix compound comprises a benzo[c]acridine compound substituted with $C_6$-$C_{40}$ aryl, $C_5$-$C_{40}$ heteroaryl and/or $C_1$-$C_{12}$ alkyl groups, preferably 7-(3-(pyren-1-yl)phenyl)benzo[c]acridine.

It may be further preferred that the first organic aromatic matrix compound comprises a triazine compound of formula (V)

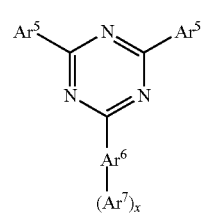

(V)

wherein $Ar^5$ is independently selected from unsubstituted or substituted $C_6$-$C_{20}$ aryl or $Ar^{5.1}$-$Ar^{5.2}$, wherein $Ar^{5.1}$ is selected from unsubstituted or substituted $C_6$-$C_{20}$ arylene and $Ar^{5.2}$ is selected from unsubstituted or substituted $C_6$-$C_{20}$ aryl or unsubstituted and substituted $C_5$-$C_{20}$ heteroaryl;

$Ar^6$ is selected from unsubstituted or substituted $C_6$-$C_{20}$ arylene, preferably phenylene, biphenylene, terphenylene, fluorenylene;

$Ar^7$ is independently selected from a group consisting of substituted or unsubstituted aryl, substituted or unsubstituted heteroaryl, the aryl and the heteroaryl having 6 to 40 ring-forming atoms, preferably phenyl, naphthyl, phenantryl, fluorenyl, terphenyl, pyridyl, quinolyl, pyrimidyl, triazinyl, benzo[h]quinolinyl, or benzo[4,5]thieno[3,2-d]pyrimidine;

x is selected from 1 or 2, wherein in case that $Ar^5$ is substituted the one or more substituents may independently be selected from $C_1$-$C_{12}$ alkyl and $C_1$-$C_{12}$ heteroalkyl, preferably $C_1$-$C_5$ alkyl;

and in case that $Ar^7$ is substituted, the one or more substituents may be independently selected from $C_1$-$C_{12}$ alkyl and $C_1$-$C_{12}$ heteroalkyl, preferably $C_1$-$C_5$ alkyl, and from $C_6$-$C_{20}$ aryl.

Suitable triazine compounds are disclosed in US 2011/284832, WO 2014/171541, WO 2015/008866, WO2015/105313, JP 2015-074649 A, and JP 2015-126140, KR 2015/0088712.

Furthermore, it is preferred that the first organic aromatic matrix compound comprises a triazine compound substituted with $C_6$-$C_{40}$ aryl, $C_5$-$C_{40}$ heteroaryl and/or $C_1$-$C_{12}$ alkyl groups, preferably 3-[4-(4,6-di-2-naphthalenyl-1,3,5-triazin-2-yl)phenyl]quinolone, 2-[3-(6'-methyl[2,2'-bipyridin]-5-yl)-5-(9-phenanthrenyl)phenyl]-4,6-diphenyl-1,3,5-triazine, 2-(3-(phenanthren-9-yl)-5-(pyridin-2-yl)phenyl)-4,6-diphenyl-1,3,5-triazine, 2,4-diphenyl-6-(5'''-phenyl-[1,1': 3',1'':3'',1''':3''',1''''-quinquephenyl]-3-yl)-1,3,5-triazine, 2-([1,1'-biphenyl]-3-yl)-4-(3'-(4,6-diphenyl-1,3,5-triazin-2-yl)-[1,1'-biphenyl]-3-yl)-6-phenyl-1,3,5-triazine and/or 2-(3'-(4,6-diphenyl-1,3,5-triazin-2-yl)-[1,1'-biphenyl]-3-yl)-4-phenylbenzo[4,5]thieno[3,2-d]pyrimidine.

In a further preferred embodiment, the first organic aromatic matrix compound comprises a benzothienopyrimidine compound substituted with $C_6$-$C_{40}$ aryl, $C_5$-$C_{40}$ heteroaryl and/or $C_1$-$C_{12}$ alkyl groups, preferably 2-phenyl-4-(4',5',6'- triphenyl-[1,1': 2',1": 3",1'''-quaterphenyl]-3'''-yl)benzo[4,5]thieno[3,2-d]pyrimidine. Suitable benzothienopyrimidine compounds are disclosed in WO 2015/0105316.

In a further preferred embodiment, the first organic aromatic matrix compound comprises a benzo[k]fluoranthene compound substituted with $C_6$-$C_{40}$ aryl, $C_5$-$C_{40}$ heteroaryl and/or $C_1$-$C_{12}$ alkyl groups, preferably 7, 12-diphenylbenzo[k]fluoranthene. Suitable benzo[k]fluoranthene compounds are disclosed in JP10189247 A2.

In a further preferred embodiment, the first organic aromatic matrix compound comprises a perylene compound substituted with $C_6$-$C_{40}$ aryl, $C_5$-$C_{40}$ heteroaryl and/or $C_1$-$C_{12}$ alkyl groups, preferably 3,9-bis([1,1'-biphenyl]-2-yl)perylene, 3,9-di(naphthalene-2-yl)perylene or 3,10-di(naphthalene-2-yl)perylene. Suitable perylene compounds are disclosed in US2007202354.

In another preferred embodiment, the first organic aromatic matrix compound is essentially non-emissive.

In the context of the present specification the term "essentially non-emissive" means that the contribution from the first organic aromatic matrix compound to the visible emission spectrum from the device is less than 10%, preferably less than 5% relative to the visible emission spectrum. The visible emission spectrum is an emission spectrum with a wavelength of about 380 nm to about ≥780 nm.

When the first organic matrix compound is selected in this range, particularly good performance is achieved.

According to another aspect of the present invention, a method is provided, wherein during sublimating the composition a second organic aromatic matrix compound is co-evaporated from a second vacuum thermal evaporation source. Thereby, fine-tuning of the performance of an organic electronic device can be achieved. The second organic aromatic matrix compound may be selected in the same range as the first organic aromatic matrix compound.

According to another aspect of the present invention, a method is provided, wherein the first alkali organic complex is a lithium organic complex, preferably selected from the group consisting of lithium quinolate, lithium borate, lithium phenolate, lithium pyridinolate.

In another embodiment, the first alkali organic complex is selected from a lithium borate.

Preferably, the rate onset temperature of the first alkali organic complex at a pressure of $10^{-5}$ to $10^{-9}$ mbar is selected within ±30° C. of the rate onset temperature of the first organic aromatic matrix compound, more preferably between ±20° C., also preferred within ±10° C. when measured under the same conditions.

Exceptionally good performance can be achieved when the first alkali organic complex is selected from the formulas in Table 2 below.

TABLE 2

| | First alkali organic complexes which may be suitable used | | | | | |
|---|---|---|---|---|---|---|
| Referred to as: | Structure | molecular weight [g/mol] | mp [° C.] | Tg [° C.] | Rate onset temperature [° C.] | Temperature at which 0.5% weight loss occurs [° C.] |
| LI-1 | | 106 | 317 | — | 174 | 296 |
| LI-2 | | 290 | 345 | — | 177 | 192 |
| LI-3 | | 286 | — | 176 | 211 | 300 |
| LiQ | | 151 | 362 | 130 | 268 | 409 |

TABLE 2-continued

First alkali organic complexes which may be suitable used

| Referred to as: | Structure | molecular weight [g/mol] | mp [° C.] | Tg [° C.] | Rate onset temperature [° C.] | Temperature at which 0.5% weight loss occurs [° C.] |
|---|---|---|---|---|---|---|
| LI-4 | 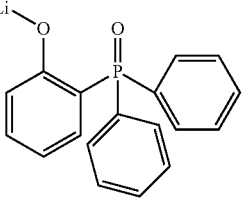 | 300 | 436 | — | 290 | 409 |

As can be seen from Table 2, the melting point of the first alkali organic complex is significantly higher than the rate onset temperature. Therefore first alkali organic complexes typically undergo sublimation.

Surprisingly, it was found that particular good performance can be achieved when the first alkali organic complex is selected in this range.

Most preferred are first alkali organic complexes

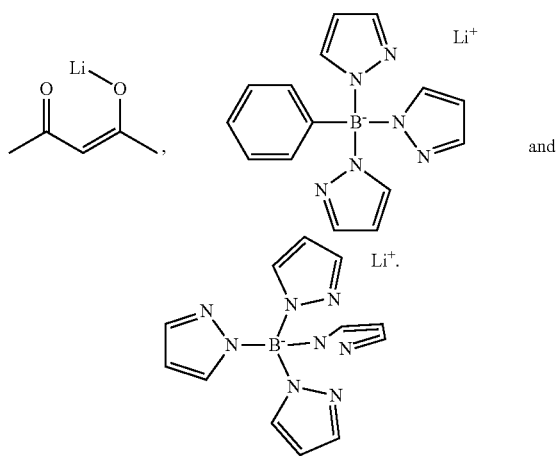

In another preferred embodiment, the first alkali organic complex is essentially non-emissive.

In the context of the present specification the term "essentially non-emissive" means that the contribution of the first alkali organic complex to the emission spectrum from the device is less than 10%, preferably less than 5% relative to the emission spectrum.

In another embodiment, the composition comprises more than 10 and less than 60 wt.-% first alkali organic complex, preferably more than 15 and less than 55 wt.-%.

When the concentration of first alkali organic complex in the composition is selected in this range, good performance of the organic electronic device is achieved.

According to another aspect of the present invention, a method is provided, wherein during sublimating the composition a second alkali organic complex is co-evaporated from a further evaporation source. Thereby, the fine-tuning of the performance of an organic electronic device can be achieved. Suitable second alkali organic complexes are described in WO2016001283A1.

According to another aspect of the present invention, a method is provided for preparing an organic semiconductor layer in a vacuum chamber at a pressure of $10^{-5}$ to $10^{-9}$ mbar comprising a step of sublimating a composition from a single vacuum thermal evaporation source arranged in the vacuum chamber, wherein the composition comprises a physical mixture of
(a) a first organic aromatic matrix compound selected from a compound comprising a phosphine oxide group or a phosphepine oxide group having a molecular weight ≥400 and ≤1,000; and
(b) a first alkali organic complex comprising a borate group having a molecular weight of ≥100 and ≤400.

According to another aspect of the present invention, a method is provided for preparing an organic semiconductor layer in a vacuum chamber at a pressure of $10^{-5}$ to $10^{-9}$ mbar comprising a step of sublimating a composition from a single vacuum thermal evaporation source arranged in the vacuum chamber, wherein the composition comprises a physical mixture of
(a) a first organic aromatic matrix compound selected from a compound comprising a phosphepine oxide group having a molecular weight ≥400 and ≤1,000; and
(b) a first alkali organic complex comprising a borate group having a molecular weight of ≥100 and ≤400.

According to another aspect of the present invention, a method is provided for preparing an organic electronic device in a vacuum chamber at a pressure of $10^{-5}$ to $10^{-9}$ mbar comprising a step of sublimating a composition from a single vacuum thermal evaporation source arranged in the vacuum chamber, wherein the composition comprises a physical mixture of
(a) a first organic aromatic matrix compound having a molecular weight ≥400 and ≤1,000; and
(b) a first alkali organic complex having a molecular weight of ≥100 and ≤400.

According to another aspect of the present invention, a method is provided for preparing an organic electronic device in a vacuum chamber at a pressure of $10^{-5}$ to $10^{-9}$ mbar comprising a step of sublimating a composition from a single vacuum thermal evaporation source arranged in the vacuum chamber, wherein the composition comprises a physical mixture of
(a) a first organic aromatic matrix compound having a molecular weight ≥400 and ≤1,000 and the rate onset temperature for sublimating the first organic aromatic matrix compound at a pressure of $10^{-5}$ to $10^{-9}$ mbar in the vacuum chamber is at least 10° C. lower than the melting point of the composition, preferably at least 20° C. lower, more preferably at least 30° C. lower; and
(b) a first alkali organic complex having a molecular weight of ≥100 and ≤400; and wherein the melting point of the composition is ≥200 and ≤450° C., preferably ≥225 and ≤400° C., also preferred ≥225 and ≤350° C.

Preferably, the organic electronic device is an organic electroluminescent device (OLED), photovoltaic cell, organic thin film transistor or battery. More preferred, the organic electronic device is an OLED.

According to another aspect of the present invention, a method is provided for preparing an organic electronic device in a vacuum chamber at a pressure of $10^{-5}$ to $10^{-9}$ mbar comprising a first step of sublimating a composition from a single vacuum thermal evaporation source arranged in the vacuum chamber, wherein the composition comprises a physical mixture of
 (a) a first organic aromatic matrix compound having a molecular weight ≥400 and ≤1,000; and
 (b) a first alkali organic complex having a molecular weight of ≥100 and ≤400; and
 a second step of depositing the composition on a solid support in the vacuum chamber to form an organic semiconductor layer.

According to another aspect of the present invention, a method is provided for preparing an organic electronic device in a vacuum chamber at a pressure of $10^{-5}$ to $10^{-9}$ mbar comprising a first step of sublimating a composition from a single vacuum thermal evaporation source arranged in the vacuum chamber, wherein the composition consisting of a physical mixture of
 (a) a first organic aromatic matrix compound having a molecular weight a ≥400 and ≤1,000; and
 (b) a first alkali organic complex having a molecular weight of ≥100 and ≤400; and
 a second step of depositing the composition on a solid support in the vacuum chamber to form an organic semiconductor layer.

According to another aspect of the present invention, a method is provided for preparing an organic electronic device in a vacuum chamber at a pressure of $10^{-5}$ to $10^{-9}$ mbar comprising a first step of sublimating a composition from a single vacuum thermal evaporation source arranged in the vacuum chamber, wherein the composition comprises a physical mixture of
 (a) a first organic aromatic matrix compound having a molecular weight ≥400 and ≤1,000 and the rate onset temperature for sublimating the first organic aromatic matrix compound at a pressure of $10^{-5}$ to $10^{-9}$ mbar in the vacuum chamber is at least 10° C. lower than the melting point of the composition, preferably at least 20° C. lower, more preferably at least 30° C. lower; and
 (b) a first alkali organic complex having a molecular weight of a ≥100 and ≤400; and
 wherein the melting point of the composition is ≥200 and ≤450° C., preferably a ≥225 and ≤400° C., also preferred ≥225 and ≤350° C.; and
 a second step of depositing the composition on a solid support in the vacuum chamber to form an organic semiconductor layer.

Preferably the second step is performed directly after the first step.

According to another aspect of the present invention, a method is provided for preparing an organic electronic device comprising a first step of sublimating the composition of the present invention from a single vacuum thermal evaporation source, a second step of depositing the composition on a solid support to form an organic semiconductor layer, a third step of evaporating at least one electrode material, and a fourth step of depositing an electrode material to form an electrode layer.

According to another aspect of the present invention, a method is provided for preparing an organic electronic device comprising a first step of evaporating at least one electrode material, a second step of depositing the electrode material to form an electrode layer, a third step of sublimating a composition from a single vacuum thermal evaporation source and a fourth step of depositing the composition on a solid support to form an organic semiconductor layer.

Preferably the fourth step is performed directly after the third step, the third step is performed directly after the second step, and the second step is performed directly after the first step.

In another preferred embodiment, the organic semiconductor layer is essentially non-emissive.

According to another aspect of the present invention, a method is provided for preparing an organic electronic device in a vacuum chamber at a pressure of $10^{-5}$ to $10^{-9}$ mbar comprising a step of sublimating a composition from a single vacuum thermal evaporation source arranged in the vacuum chamber, wherein the composition comprises a physical mixture of
 (a) a first organic aromatic matrix compound selected from a compound comprising a phosphine oxide or a phosphepine oxide group having a molecular weight ≥400 and ≤1,000; and
 (b) a first alkali organic complex selected from a borate group having a molecular weight of ≥100 and ≤400.

According to another aspect of the present invention, a method is provided for preparing in a vacuum chamber at a pressure of $10^{-5}$ to $10^{-9}$ mbar an organic electronic device comprising a step of sublimating a composition from a single vacuum thermal evaporation source arranged in the vacuum chamber, wherein the composition comprises a physical mixture of
 a) a first organic aromatic compound selected from a compound comprising a phosphepine oxide group having a molecular weight ≥400 and ≤1,000; and
 b) a first alkali organic complex comprising a borate group having a molecular weight of ≥100 and ≤400.

The melting point, also named mp or Mp, is measured in degree Celsius (° C.) at atmospheric pressure.

The glass transition temperature, also named Tg, is measured in degree Celsius (° C.) at atmospheric pressure.

The VTE source temperature is measured in degree Celsius (° C.).

The rate onset temperature, also named RO, is measured in degree Celsius (° C.) at $10^{-7}$ to $10^{-8}$ mbar. The rate onset temperature describes the VTE source temperature at which the compound is transferred into the gas phase at a rate sufficient to detect a deposition rate of 0.02 Angstrom per second.

The pressure is measured in millibar (mbar).

The deposition rate is measured in Ångstrom per second (Å/s).

The operating voltage, also named U, is measured in Volt (V).

The current density is measured in milliAmpere per square centimeter ($mA/cm^2$).

The efficiency, also named Eff, is measured in candela per Ampere (cd/A).

The power efficiency, also named lm/W efficiency, is measured in lumen per Watt (lm/W).

The external quantum efficiency, also named EQE, is measured in percent (%). The color space is described by coordinates CIE-x and CIE-y (International Commission on Illumination 1931). For blue emission the CIE-y is of particular importance. A smaller CIE-y denotes a deeper blue color.

The color space is described by coordinates CIE-x and CIE-y (International Commission on Illumination 1931). For blue emission the CIE-y is of particular importance. A smaller CIE-y denotes a deeper blue color.

The highest occupied molecular orbital, also named HOMO, and lowest unoccupied molecular orbital, also named LUMO, are measured in electron volt (eV).

The term "OLEO", "organic light emitting diode" and "organic light-emitting diode" are simultaneously used and have the same meaning.

As used herein, "weight percent", "wt.-%", "percent by weight", "% by weight", and variations thereof refer to a composition, component, substance or agent as the weight of that composition, component, substance or agent of the respective electron transport layer divided by the total weight of the composition thereof and multiplied by 100. It is understood that the total weight percent amount of all components, substances or agents of the respective electron transport layer are selected such that it does not exceed 100 wt.-%.

As used herein, "volume percent", "vol.-%", "percent by volume", "% by volume", and variations thereof refer to an elemental metal, a composition, component, substance or agent as the volume of that elemental metal, component, substance or agent of the respective electron transport layer divided by the total volume of the respective electron transport layer thereof and multiplied by 100. It is understood that the total volume percent amount of all elemental metal, components, substances or agents of the respective cathode electrode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not, modified by the term "about", the claims include equivalents to the quantities.

It should be noted that, as used in this specification and the appended claims, the singular forms "a", "an" and "the" include plural referents unless the content clearly dictates otherwise.

The term "free of", "does not contain", "does not comprise" does not exclude impurities which may be present in the compounds prior to deposition. Impurities have no technical effect with respect to the object achieved by the present invention.

The term "organic" refers to compounds which substantially comprise C, H, O, N, S, P, Se, and B.

The term "aromatic" refers to compounds which comprise at least one moiety which is aromatic as defined by the Hückel rule.

The term "alkyl" refers to straight-chain branched or cyclic alkyl groups.

The alkyl groups can be selected from the group comprising methyl, ethyl and the isomers of propyl, butyl or pentyl, such as isopropyl, isobutyl, tert.-butyl, sec.-butyl, isopentyl and/or cyclohexyl.

The terms "aryl" and "arylene" refer to aromatic groups. The terms "aryl" and "arylene" as used herewith shall encompass phenyl (C6-aryl), fused aromatics, such as naphthalene, anthracene, phenanthrene, tetracene etc. Further encompassed are bi-phenyl and oligo- or polyphenyls, such as terphenyl etc. Further encompassed shall be any further aromatic hydrocarbon substituents, such as fluorenyl etc.

The terms "heteroaryl" and "heteroarylene" refer to heteroaromatic groups. The terms "heteroaryl" and "heteroarylene" as used herewith shall encompass pyridine, pyrimidine, triazine, carbazole, benzimidazole, benzoacridine, dibenzoacridine etc.

In the context of the present invention, the term "evaporation" and "evaporated" mean transfer of the compound and/or composition from the liquid into the gap phase.

Herein, when a first element is referred to as being formed or disposed "on" a second element, the first element can be disposed directly on the second element or one or more other elements may be disposed there between. When a first element is referred to as being formed or disposed "directly on" a second element, no other elements are disposed there between.

The term "contacting sandwiched" refers to an arrangement of three layers whereby the layer in the middle is in direct contact with the two adjacent layers.

The anode electrode and cathode electrode may be described as anode electrode/cathode electrode or anode electrode/cathode electrode or anode electrode layer/cathode electrode layer.

The organic light emitting diode according to the invention may comprise the following constituents. In this regard, the respective constituents may be as follows.

Substrate

The substrate may be any substrate that is commonly used in manufacturing of organic light-emitting diodes. If light is emitted through the substrate, the substrate may be a transparent material, for example a glass substrate or a transparent plastic substrate, having excellent mechanical strength, thermal stability, transparency, surface smoothness, ease of handling, and water-proofness. If light is emitted through the top surface, the substrate may be a transparent or nontransparent material, for example a glass substrate, a plastic substrate, a metal substrate or a silicon substrate.

Electrodes

The electrodes are the anode and the cathode. They must provide a certain amount of conductivity, being preferentially conductors. Preferentially the "first electrode" is the cathode. At least one of the electrodes must be semitransparent or transparent to enable the light transmission to the outside of the device. Typical electrodes are layers or a stack of layer, comprising metal and/or transparent conductive oxide. Other possible electrodes are made of thin busbars (e.g. a thin metal grid) wherein the spaces between the busbars is filled (coated) with a transparent material with a certain conductivity, such as graphene, carbon nanotubes, doped organic semiconductors, etc.

In one mode, the anode is the electrode closest to the substrate, which is called non-inverted structure. In another mode, the cathode is the electrode closest to the substrate, which is called inverted structure.

Typical materials for the anode are ITO and Ag. Typical materials for the cathode are Mg:Ag (10 vol. % of Mg), Ag, ITO, Al. Mixtures and multilayer are also possible.

Preferably, the cathode comprises a metal selected from Ag, Al, Mg, Ba, Ca, Yb, In, Zn, Sn, Sm, Bi, Eu, Li, more preferably from Al, Mg, Ca, Ba and even more preferably selected from Al or Mg. Preferred is also a cathode comprising an alloy of Mg and Ag.

Hole Injection Layer

The hole injection layer (HIL) 130 may be formed on the anode electrode 120 by vacuum deposition, spin coating, printing, casting, slot-die coating, Langmuir-Blodgett (LB) deposition, or the like. When the HIL 130 is formed using vacuum deposition, the deposition conditions may vary according to the compound that is used to form the HIL 130, and the desired structure and thermal properties of the HIL 130. In general, however, conditions for vacuum deposition may include a deposition temperature of 100° C. to 500° C., a pressure of $10^{-8}$ to $10^{-3}$ Torr (1 Torr equals 133.322 Pa), and a deposition rate of 0.1 to 10 nm/sec.

When the HIL 130 is formed using spin coating, printing, coating conditions may vary according to a compound that is used to form the HIL 130, and the desired structure and thermal properties of the HIL 130. For example, the coating conditions may include a coating speed of about 2000 rpm to about 5000 rpm, and a thermal treatment temperature of about 80° C. to about 200° C. Thermal treatment removes a solvent after the coating is performed.

The HIL 130 may be formed of any compound that is commonly used to form an HIL. Examples of compounds that may be used to form the HIL 130 include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

The HIL 130 may be a pure layer of p-dopant or may be selected from a hole-transporting matrix compound doped with a p-dopant. Typical examples of known redox doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis (naphthalen-1-yl)-N,N'-bis(phenyl)-benzidine) doped with F4TCNQ. α-NPD doped with 2,2'-(perfluoronaphthalen-2,6-diylidene) dimalononitrile (PD1). α-NPD doped with 2,2',2"-(cyclopropane-1,2,3-triylidene)tris(2-(p-cyanotetrafluorophenyl)acetonitrile) (PD2). Dopant concentrations can be selected from 1 to 20 wt.-%, more preferably from 3 wt.-% to 10 wt.-%.

The thickness of the HIL 130 may be in the range of about 1 nm to about 100 nm, and for example, about 1 nm to about 25 nm. When the thickness of the HIL 130 is within this range, the HIL 130 may have excellent hole injecting characteristics, without a substantial increase in driving voltage.

Hole Transport Layer

The hole transport layer (HTL) 140 may be formed on the HIL 130 by vacuum deposition, spin coating, slot-die coating, printing, casting, Langmuir-Blodgett (LB) deposition, or the like. When the HTL 140 is formed by vacuum deposition or spin coating, the conditions for deposition and coating may be similar to those for the formation of the HIL 130. However, the conditions for the vacuum or solution deposition may vary, according to the compound that is used to form the HTL 140.

The HTL 140 may be formed of any compound that is commonly used to form a HTL. Compound that can be suitably used is disclosed for example in Yasuhiko Shirota and Hiroshi Kageyama, Chem. Rev. 2007, 107, 953-1010 and incorporated by reference. Examples of the compound that may be used to form the HTL 140 are: a carbazole derivative, such as N-phenylcarbazole or polyvinylcarbazole; an amine derivative having an aromatic condensation ring, such as N,N'-bis(3-methylphenyl)-N,N'-diphenyl-[1,1-biphenyl]-4,4'-diamine (TPD), or N,N'-di(naphthalen-1-yl)-N,N'-diphenyl benzydine (alpha-NPD); and a triphenylamine-based compound, such as 4,4',4"-tris(N-carbazolyl) triphenylamine (TCTA). Among these compounds, TCTA can transport holes and inhibit excitons from being diffused into the EML.

The thickness of the HTL 140 may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL 140 may be 170 nm to 200 nm.

When the thickness of the HTL 140 is within this range, the HTL 140 may have excellent hole transporting characteristics, without a substantial increase in driving voltage.

Electron Blocking Layer

The function of the electron blocking layer (EBL) 150 is to prevent electrons from being transferred from the emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer is selected between 2 and 20 nm.

The electron blocking layer may comprise a compound of formula Z below

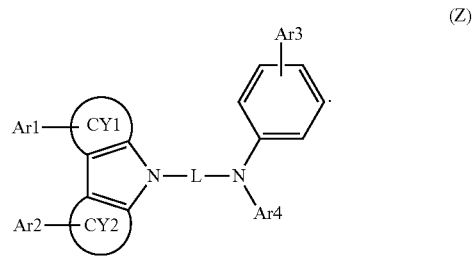

(Z)

In Formula Z,

CY1 and CY2 are the same as or different from each other, and each independently represent a benzene cycle or a naphthalene cycle, Ar1 to Ar3 are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms, Ar4 is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms, L is a substituted or unsubstituted arylene group having 6 to 30 carbon atoms.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable triplet control layer, in particular the triarylamine compounds, are described in EP 2 722 908 A1.

Emission Layer (EML)

The EML 150 may be formed on the HTL by vacuum deposition, spin coating, slot-die coating, printing, casting, LB, or the like. When the EML is formed using vacuum deposition or spin coating, the conditions for deposition and coating may be similar to those for the formation of the HIL. However, the conditions for deposition and coating may vary, according to the compound that is used to form the EML.

The emission layer (EML) may be formed of a combination of a host and a dopant. Example of the host are Alq3, 4,4'-N,N'-dicarbazole-biphenyl (CAP), poly(n-vinylcarbazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBI), 3-tert-butyl-9,10-di-2-naphthylanthracenee (TBADN), distyrylarylene (DSA), Bis(2-(2-hydroxyphenyl)benzothiazolate)zinc (Zn(BTZ) 2), E3 below, AND, Compound 1 below, and Compound 2 below.

E3

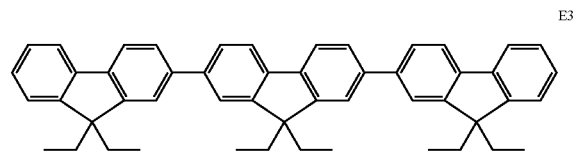

ADN

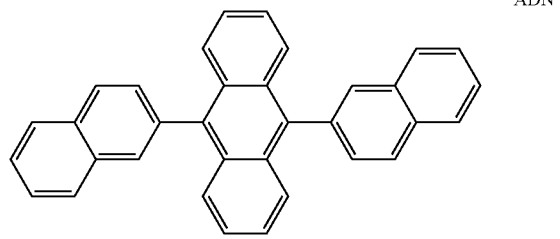

Compound 1

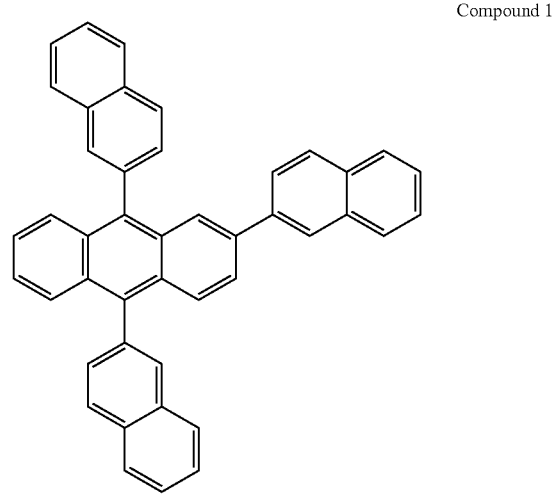

Compound 2

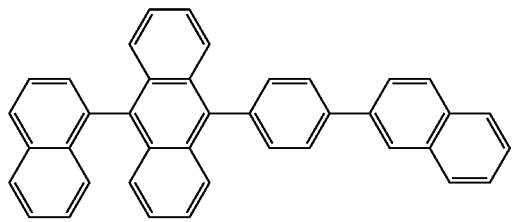

The dopant may be a phosphorescent or fluorescent emitter. Phosphorescent emitters and emitters which emit light via a thermally activated delayed fluorescence (TADF) mechanism are preferred due to their higher efficiency. The emitter may be a small molecule or a polymer.

Examples of a red dopant are PtOEP, Ir(piq) 3, and Btp 2Ir(acac), but are not limited thereto. These compounds are phosphorescent emitters, however, fluorescent red dopants could also be used.

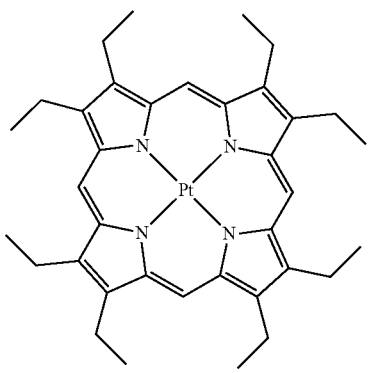

PtOEP

Ir(piq)$_3$

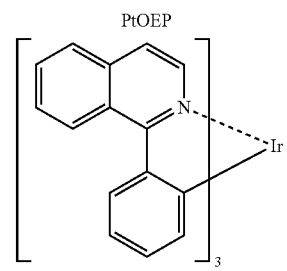

Btp$_2$Ir(acac)

Examples of a phosphorescent green dopant are Ir(ppy) 3 (ppy=phenylpyridine), Ir(ppy) 2(acac), Ir(mpyp) 3 are shown below. Compound 3 is an example of a fluorescent green emitter and the structure is shown below.

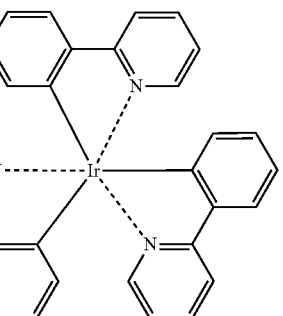

Ir(ppy)₃

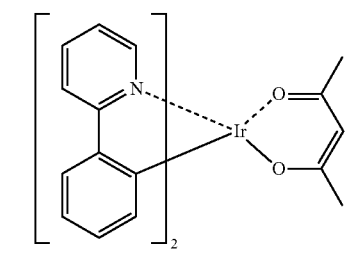

Ir(ppy)₂(acac)

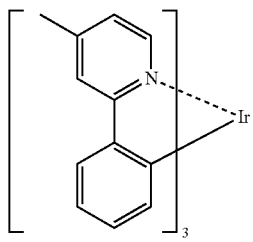

Ir(mpyp)₃

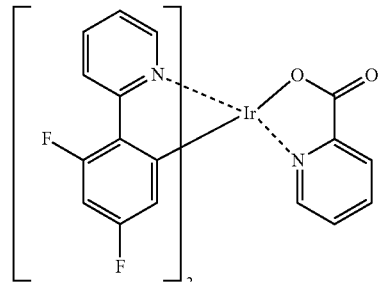

F₂Irpic

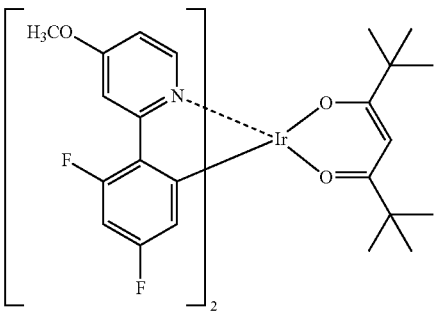

(F₂ppy)₂Ir(tmd)

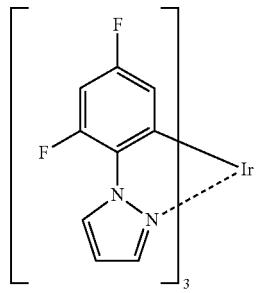

Ir(dfppz)3

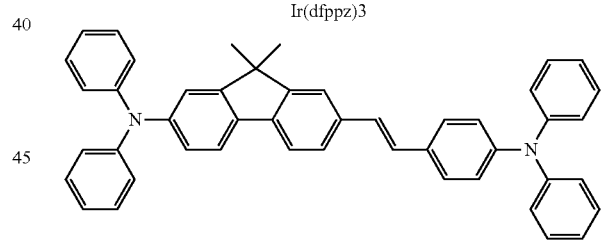

Compound 4

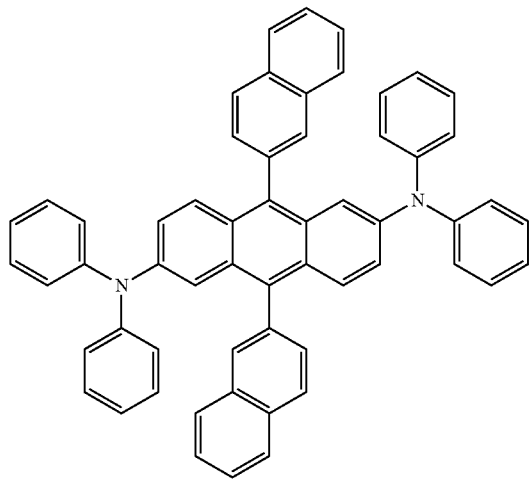

Compound 3

Examples of a phosphorescent blue dopant are F₂Irpic, (F₂ppy)₂Ir(tmd) and Ir(dfppz) 3, terfluorene, the structures are shown below. 4,4'-bis(4-diphenyl amiostyryl)biphenyl (DPAVBi), 2,5,8,11-tetra-tert-butyl perylene (TBPe), and Compound 4 below are examples of fluorescent blue dopants.

The amount of the dopant may be in the range of about 0.01 to about 50 parts by weight, based on 100 parts by weight of the host. Alternatively, the emission layer may consist of a light-emitting polymer. The EML may have a thickness of about 10 nm to about 100 nm, for example, about 20 nm to about 60 nm. When the thickness of the EML is within this range, the EML may have excellent light emission, without a substantial increase in driving voltage.

Hole Blocking Layer (HBL)

When the EML comprises a phosphorescent dopant, a hole blocking layer (HBL) may be formed on the EML, by using vacuum deposition, spin coating, slot-die coating, printing, casting, LB deposition, or the like, in order to prevent the diffusion of triplet excitons or holes into the ETL.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include an oxadiazole derivative, a triazole derivative, and a phenanthroline derivative.

The HBL may have a thickness of about 5 nm to about 100 nm, for example, about 10 nm to about 30 nm. When the thickness of the HBL is within this range, the HBL may have excellent hole-blocking properties, without a substantial increase in driving voltage.

Electron Transport Layer

The OLED according to the present invention may optional contain an electron transport layer (ETL).

According to various embodiments the OLED may comprises an electron transport layer or an electron transport layer stack comprising at least a first electron transport layer and at least a second electron transport layer.

According to various embodiments of the OLED of the present invention the electron transport layer may comprises at least one matrix compound. Preferably, the matrix compound is an organic compound. More preferably the matrix compound is a covalent organic matrix compound. In other words, the matrix compound comprises covalent bonds. It is to be understood that "substantially covalent" means compounds comprising elements bound together mostly by covalent bonds.

According to another aspect, an organic light emitting diode is provided, wherein an electron transport layer is arranged between the emission layer and the organic semiconductor layer of the present invention. Preferably, the electron transport layer is in direct contact with the emission layer and the organic semiconductor layer is contacting sandwiched between the electron transport layer and the cathode electrode.

Preferably, the electron transport layer is free of emitter dopants and/or alkali organic complexes.

According to another aspect, the electron transport layer comprises a first organic matrix compound.

According to a more preferred aspect the first organic matrix compound is selected from the group comprising benzo[k]fluoranthene, pyrene, anthracene, fluorene, spiro (bifluorene), phenanthrene, perylene, triptycene, spiro[fluorene-9,9'-xanthene], coronene, triphenylene, xanthene, benzofurane, dibenzofurane, dinaphthofurane, acridine, benzo[c]acridine, dibenzo[c,h]acridine, dibenzo[a,j]acridine, triazine, pyridine, pyrimidine, carbazole, phenyltriazole, benzimidazole, phenanthroline, oxadiazole, benzooxazole, oxazole, quinazoline, benzo[h]quinazoline, pyrido[3,2-h]quinazoline, pyrimido[4,5-f]quinazoline, quinoline, benzoquinoline, pyrrolo[2,1-a]isoquinolin, benzofuro[2,3-d]pyridazine, thienopyrimidine, dithienothiophene, benzothienopyrimidine, benzothienopyrimidine, phosphine oxide, phosphole, triaryl borane, 2-(benzo[d]oxazol-2-yl)phenoxy metal complex, 2-(benzo[d]thiazol-2-yl)phenoxy metal complex or mixtures thereof.

Method of Manufacture

According to various embodiments of the present invention, the method may further include forming on a substrate an anode electrode a hole injection layer, a hole transport layer, optional an electron blocking layer, an emission layer, optional a hole blocking layer, optional an electron transport layer, the organic semiconductor layer formed by subliming the composition from a single vacuum thermal evaporation source, optional an electron injection layer, and a cathode electrode layer, wherein the layers are arranged in that order; or the layers can be deposited the other way around, starting with the cathode electrode layer, and more preferred the organic semiconductor layer is be deposited before the cathode electrode layer is deposited.

Additional aspects and/or advantages of the invention will be set forth in part in the description which follows and, in part, will be obvious from the description, or may be learned by practice of the invention.

DESCRIPTION OF FURTHER EMBODIMENTS

These and/or other aspects and advantages of the present invention will become apparent and more readily appreciated from the following description of the exemplary embodiments, taken in conjunction with the accompanying drawings, of which:

Figure 1A:
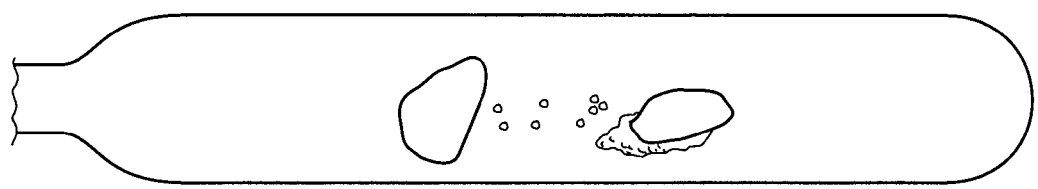
FIGS. 1a and 1b are photos of ampoules containing a composition according to a comparative example in accordance with the prior art.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

Figure 1B:
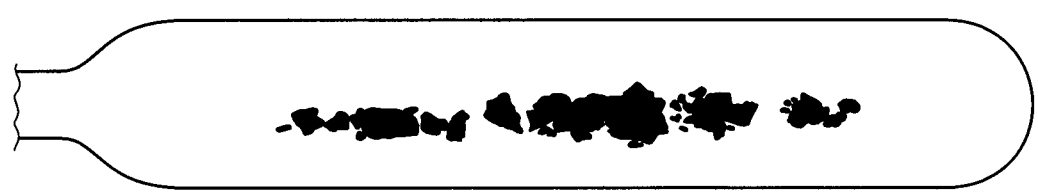

FIG. 1 shows photos of ampoules containing comparative example 6 (see Table 4) which have been heated to a temperature of 25° C. above rate onset temperature and to a temperature of 50° C. above rate onset temperature. After heating to 25° C. above rate onset temperature, the composition has melted (FIG. 1a). After heating to 50° C. above rate onset temperature, the composition has turned into a black solid (FIG. 1b). This can be taken as evidence of decomposition. The temperature range has been selected as an indication of long-term stability at a VTE source temperature suitable for mass production.

Figure 2A:
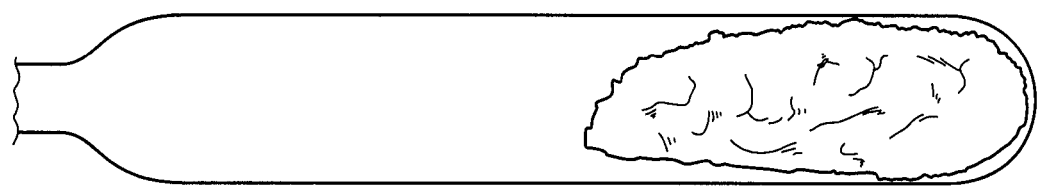
FIGS. 2a and 2b are photos of ampoules containing a composition according to an exemplary embodiment of the present invention.
Figure 2B:
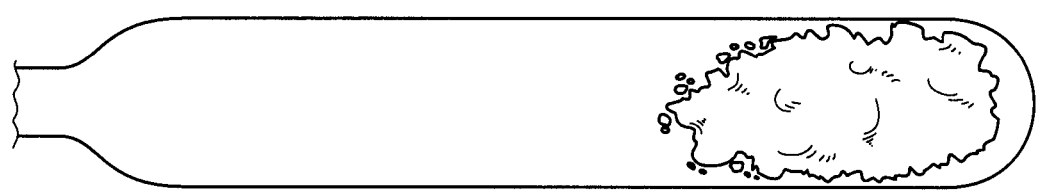

FIG. 2 shows photos of ampoules containing example 6 (see Table 4) which have been heated to a temperature of 25° C. (FIG. 2a) and 50° C. (FIG. 2b) above rate onset temperature. Even after heating to 50° C. above rate onset temperature, the composition is still a solid. No noticeable color change has taken place. This indicates that negligible decomposition has taken place.

Figure 3:
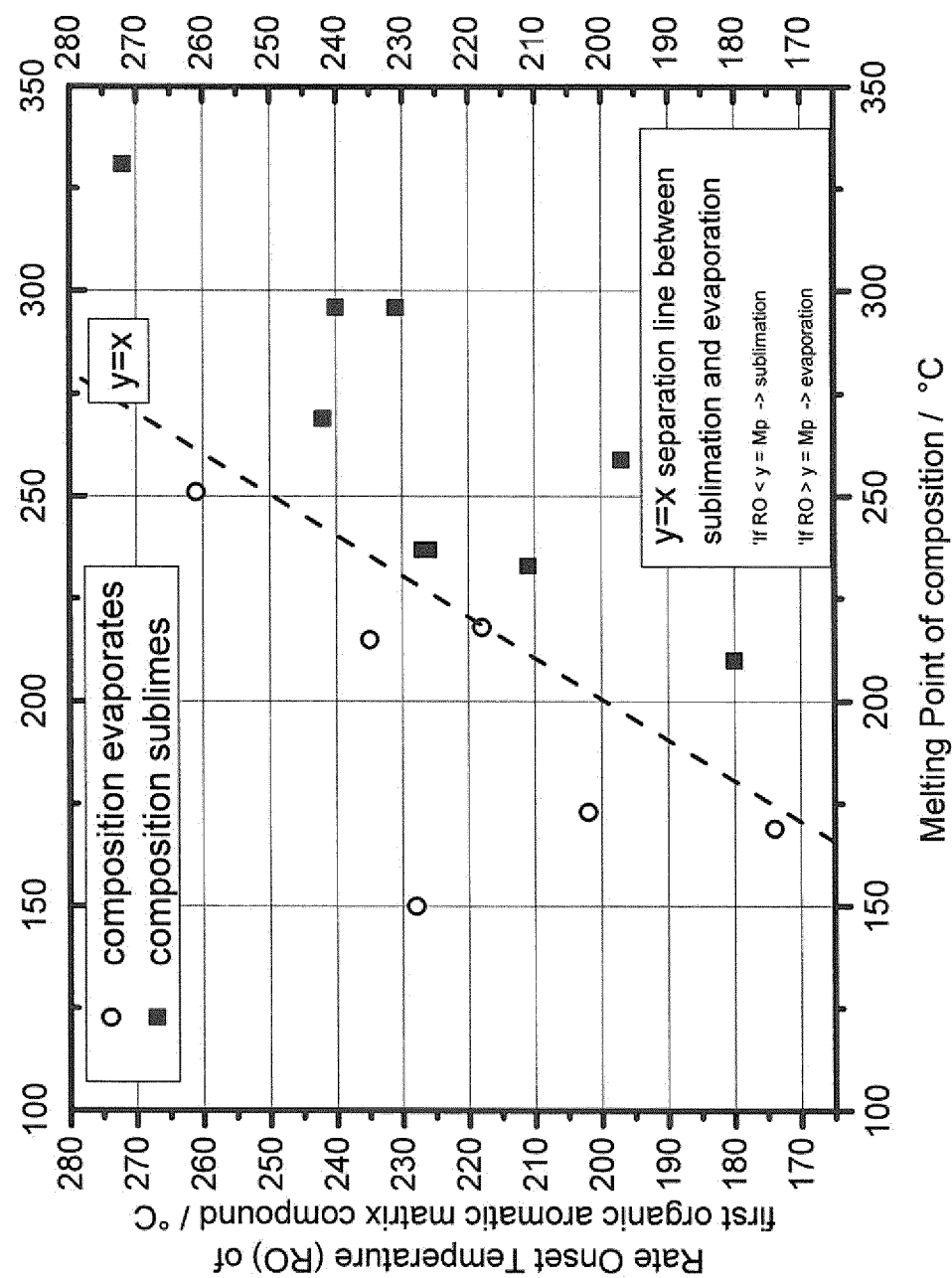
FIG. 3 is a graph of rate onset temperature of the composition against melting point of the composition according to an exemplary embodiment of the present invention.

FIG. 3 shows the correlation between rate onset temperature of the first organic aromatic matrix compound (y) and melting point of the composition (x). For y=x, a trend line is shown. Compositions which undergo evaporation are above the trend line, while compositions which undergo sublimation are beneath the trend line.

Figure 4:
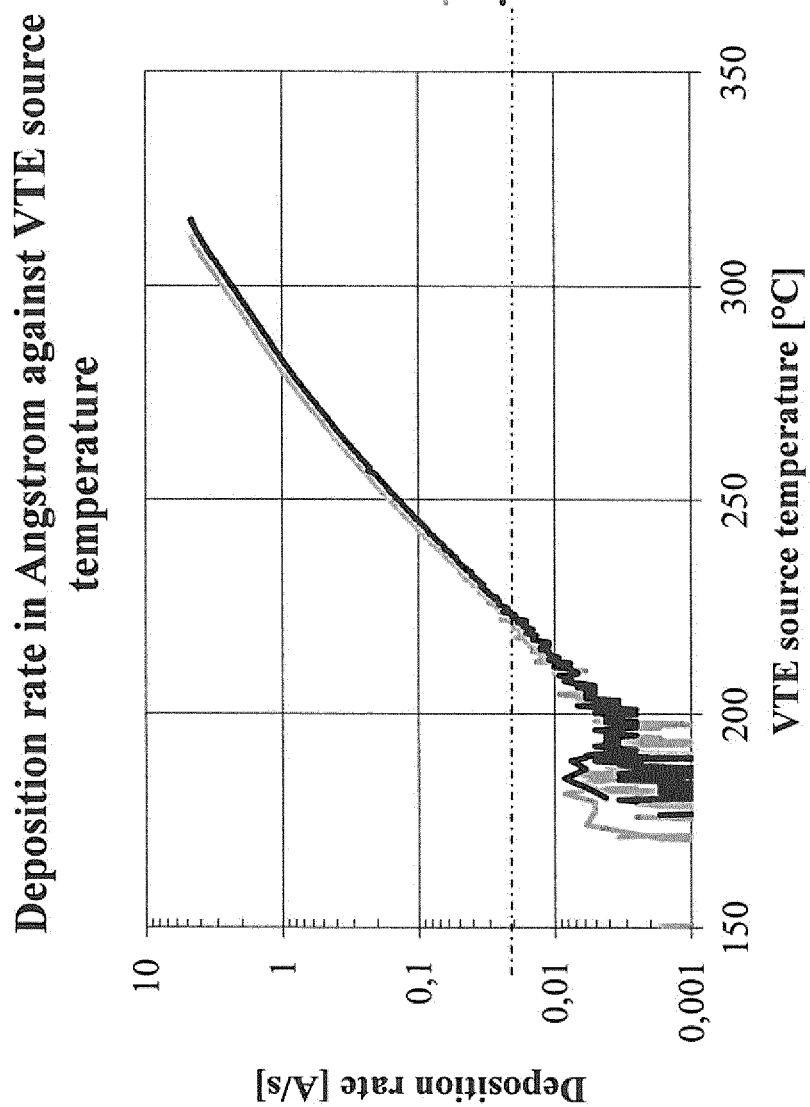
FIG. 4 is a graph of the deposition rate plotted against temperature of the VTE source.

Regarding FIG. 4, a detailed explanation is provided below.

Figure 5:
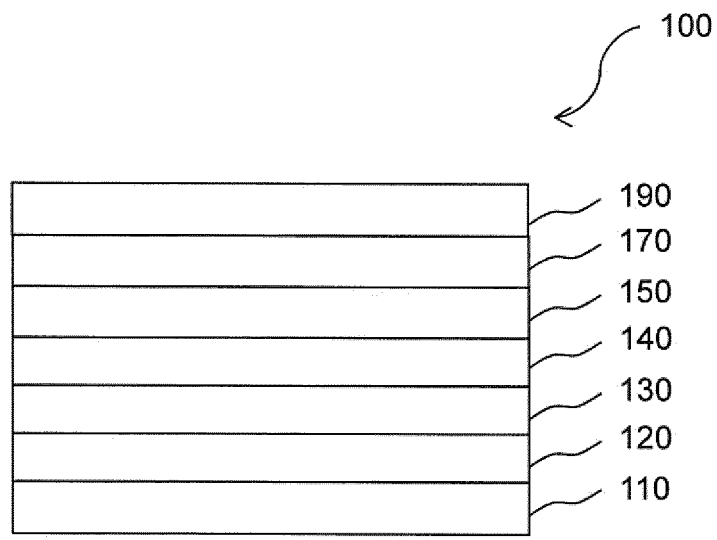
FIG. 5 is a schematic sectional view of an organic light-emitting diode (OLED), according to an exemplary embodiment of the present invention.

FIG. 5 is a schematic sectional view of an organic light-emitting diode (OLED) 100, according to an exemplary embodiment of the present invention. The OLED 100 includes a substrate 110, an anode electrode 120, a hole injection layer (HIL) 130, a hole transport layer (HTL) 140, an emission layer (EML) 150. Onto the emission layer (EML) 150 the organic semiconductor layer 170 is disposed. The organic semiconductor layer 170 comprising or consisting of the first alkali organic complex and the first organic aromatic matrix compound is formed directly on the EML 150. The cathode electrode layer 190 is disposed directly onto the organic semiconductor layer 170.

Figure 6:
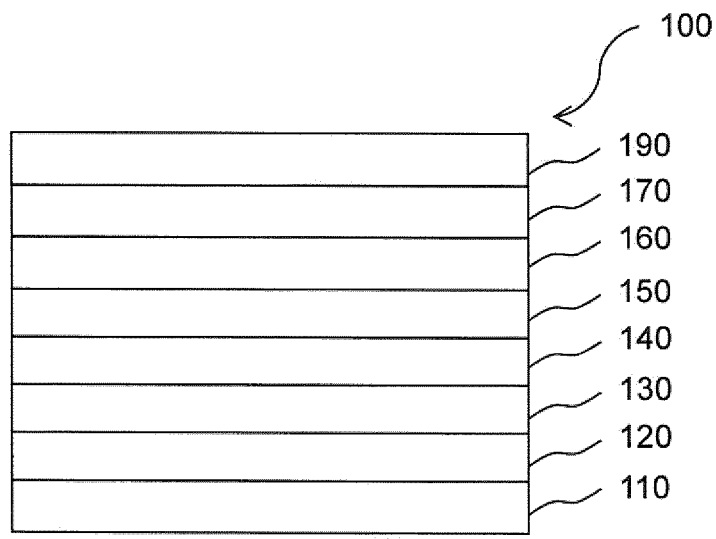
FIG. 6 is a schematic sectional view of an organic light-emitting diode (OLED), according to an exemplary embodiment of the present invention.

FIG. 6 is a schematic sectional view of an OLED 100, according to another exemplary embodiment of the present invention. FIG. 6 differs from FIG. 5 in that the OLED 100 of FIG. 6 comprises an electron transport layer 160.

Referring to FIG. 6 the OLED 100 includes a substrate 110, an anode electrode 120, a hole injection layer (HIL) 130, a hole transport layer (HTL) 140, an emission layer (EML) 150. Onto the emission layer (EML) 150 an electron transport layer (ETL) 160 is disposed. Onto the electron transport layer (ETL) 160 the organic semiconductor layer 170 is disposed. The organic semiconductor layer 170 comprising or consisting of the first alkali organic complex and the first organic aromatic matrix compound is formed directly on the ETL 160. The cathode electrode layer 190 is disposed directly onto the organic semiconductor layer 170.

In the description above the method of manufacture an OLED 100 of the present invention is started with a substrate 110 onto which an anode electrode 120 is formed, on the anode electrode 120, a first hole injection layer 130, first hole transport layer 140, optional a first electron blocking layer 145, a first emission layer 150, optional a first hole blocking layer 155, optional an ETL 160, the organic semiconductor layer 170 and a cathode electrode layer 191 are formed in that order or the other way around.

While not shown in FIG. 5 and FIG. 6, a sealing layer may further be formed on the cathode electrodes 190, in order to seal the OLEDs 10
0. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

EXAMPLES

First organic aromatic matrix compounds may be synthesized as described in WO2013079217A1, WO2015052284A1 and U.S. Pat. No. 6,878,469B2.

LI-3 and LI-2 may be synthesized as described in WO2013079676A1. LiQ and LI-1 are commercially available.

The melting point is determined as peak temperatures from the DSC curves of the above TGA-DSC measurement or from separate DSC measurements (Mettler Toledo DSC822e, heating of samples from room temperature to completeness of melting with heating rate 10 K/min under a stream of pure nitrogen. Sample amounts of 4 to 6 mg are placed in, a 40 µL Mettler Toledo aluminum pan with lid, a <1 mm hole is pierced into the lid).

The glass transition temperature is measured under nitrogen and using a heating rate of 10 K per min in a Mettler Toledo DSC 822e differential scanning calorimeter as described in DIN EN ISO 11357, published in March 2010.

Weight loss curves in TGA (thermogravimetric analysis) are measured by means of a Mettler Toledo TGA-DSC 1 system, heating of samples from room temperature to 600° C. with heating rate 10 K/min under a stream of pure nitrogen. 9 to 11 mg sample are placed in a 100 µL Mettler Toledo aluminum pan without lid. The temperature is determined at which 0.5 wt.-% weight loss occurs.

As VTE source a point source for organic materials is used as supplied by Kurt. J. Lesker Company (www.lesker-.com) or CreaPhys GmbH (http://www.creaphys.com).

The VTE source temperature is determined through a thermocouple in direct contact with the compound in the VTE source.

The rate onset temperature for transfer into the gas phase is determined by loading 100 mg compound into a VTE source. The VTE source is heated at a constant rate of 15 K/min at a pressure of $10^{-7}$ to $10^{-8}$ mbar in the vacuum chamber and the temperature inside the source measured with a thermocouple. Evaporation of the compound is detected with a QCM detector which detects deposition of the compound on the quartz crystal of the detector. The deposition rate on the quartz crystal is measured in Angstrom per second. To determine the rate onset temperature, the deposition rate on a logarithmic scale is plotted against the VTE source temperature. The rate onset is the temperature at which noticeable deposition on the QCM detector occurs (defined as a rate of 0.02 Å/s [see FIG. 4]). For accurate results, the VTE source is heated and cooled three time and only results from the second and third run are used to determine the rate onset temperature.

The rate onset temperature is an indirect measure of the volatility of a compound. The higher the rate onset temperature the lower is the volatility of a compound.

The physical state of the composition in the VTE source is predicted based on the difference between melting point of composition and rate onset temperature of the first organic aromatic matrix compound. If this difference is ≤0, the evaporation occurs. If this difference is >0, sublimation takes place. It is also possible to assess the physical state of the composition after removal of the VTE source from the vacuum chamber. If sublimation occurred, the contents of the VTE source will be a power or a glass. If the contents of the VTE source has melted during heating it will have formed a solidified melt during cooling.

The thermal stability of the composition at elevated temperatures is determined through a thermal stress test under vacuum. 100 mg composition is loaded into a glass ampoule. The ampoule is evacuated ($10^{-2}$ mbar) and purged with nitrogen three times and sealed in vacuo ($10^{-2}$ mbar). The ampoule is placed in an oven at the desired temperature for 10 days. After cooling to room temperature, the composition is inspected visually and analysed by standard analytical techniques.

To assess the reproducibility of the concentration of first alkali organic complex in the organic semiconductor layer prepared over time at a constant deposition rate, the composition is heated in a single VTE source at a pressure of $10^{-7}$ to $10^{-8}$ mbar in the vacuum chamber until the VTE source is less than 40% empty and the composition is deposited subsequently on individual quartz substrates to form an organic semiconductor layer. UV/Vis spectra of the deposited organic semiconductor layer are analysed to determine the concentration of first alkali organic complex in the composition. Each component in the composition usually shows specific peaks in the absorbance spectrum (optical density=lg[1/T(lambda)]), which are used to define a calibration curve (concentration over peak ratio) using 100 nm thick co-deposited reference layers on quartz glass of different concentrations processed at a pressure of $10^{-7}$ to $10^{-8}$ mbar. A layer of the composition with a thickness of 100 nm on quartz glass is then again optically characterized via optical density. The ratio of the material specific absorbance peaks gives a proper estimation regarding the concentration within the layer.

Organic Light-Emitting Diodes

For top emission devices, a glass substrate was cut to a size of 50 mm×50 mm×0.7 mm, ultrasonically cleaned with isopropyl alcohol for 5 minutes and then with pure water for 5 minutes, and cleaned again with UV ozone for 30 minutes. The substrate is transferred to the vacuum chamber. The vacuum chamber is evacuated to achieve a pressure of $10^{-7}$ to $10^{-8}$ mbar.

Then 100 nm Ag was deposited on the glass substrate to form the anode.

Then, 92 wt.-% of Biphenyl-4-yl(9,9-diphenyl-9H-fluoren-2-yl)-[4-(9-phenyl-9H-carbazol-3-yl)phenyl]-amine (CAS 1242056-42-3) and 8 wt.-% of 2,2',2"-(cyclopropane-1,2,3-triylidene)tris(2-(p-cyanotetrafluorophenyl)acetonitrile) was vacuum deposited on the Ag electrode, to form a HIL having a thickness of 10 nm. Then Biphenyl-4-yl(9,9-diphenyl-9H-fluoren-2-yl)-[4-(9-phenyl-9H-carbazol-3-yl)phenyl]-amine was vacuum deposited on the HIL, to form a HTL having a thickness of 119 nm. 97 wt.-% of ABH113 (Sun Fine Chemicals) as a host and 3 wt.-% of NUBD370 (Sun Fine Chemicals) as a dopant were deposited on the HTL, to form a blue-emitting EML with a thickness of 20 nm.

Then a HBL with a thickness of 5 nm is formed from a 1:1 molar ratio of 2,4-diphenyl-6-(3'-(triphenylen-2-yl)-[1,1'-biphenyl]-3-yl)-1,3,5-triazine (CAS 1638271-85-8) and 9-([1,1'-biphenyl]-3-yl)-9'-([1,1'-biphenyl]-4-yl)-9H,9'H-3,3'-bicarbazole (CAS 1643479-47-3) on the EML.

Then a 28 nm thick layer of ABH113 (Sun Fine Chemicals) is deposited onto the HBL as ETL.

Then an EIL with a thickness of 3 nm is formed from a first organic aromatic matrix compound and a first alkali organic complex on the ETL. The composition can be seen in Table 4.

Then cathode was evaporated. Therefore, a thermal single co-evaporation of one or several metals was performed with a rate of 0, 1 to 10 nm/s (0.01 to 1 Å/s) in order to generate a homogeneous cathode with a thickness of 5 to 1000 nm. For top emission devices, the cathode electrode was formed from 13 nm magnesium (90 vol.-%) and silver (10 vol.-%) alloy, followed by 60 nm Biphenyl-4-yl(9,9-diphenyl-9H-fluoren-2-yl)-[4-(9-phenyl-9H-carbazol-3-yl)phenyl]-amine.

The OLED stack is protected from ambient conditions by encapsulation of the device with a glass slide. Thereby, a cavity is formed, which includes a getter material for further protection.

To assess the performance of the inventive examples compared to the prior art, the current efficiency is measured under ambient conditions (20° C.). Current voltage measurements are performed using a Keithley 2400 sourcemeter, and recorded in V. At 9 mA/cm$^2$ for top emission devices, a calibrated spectrometer CAS140 from Instrument Systems is used for measurement of CIE coordinates and brightness in Candela. Lifetime LT of bottom emission device is measured at ambient conditions (20° C.) and 10 mA/cm$^2$, using a Keithley 2400 sourcemeter, and recorded in hours. Lifetime LT of top emission device is measured at ambient conditions (20° C.) and 8 mA/cm$^2$. The brightness of the device is, measured using a calibrated photo diode. The lifetime LT is defined as the time till the brightness of the device is reduced to 97% of its initial value.

The efficiency in cd/A and power efficiency (lm/W efficiency) are determined at 9 mA/cm$^2$ for top emission devices.

To determine the power efficiency in lm/W, in a first step the luminance in candela per square meter (cd/m2) is measured with an array spectrometer CAS140 CT from Instrument Systems which has been calibrated by Deutsche Akkreditierungsstelle (DAkkS). In a second step, the luminance is then multiplied by $\pi$ and divided by the voltage and current density.

Technical Effect of the Invention

The physical properties of first organic aromatic matrix compounds are summarized in Table 3.

In Table 4, the composition, physical state and rate onset temperature of the first organic aromatic matrix compound, melting point of the composition, difference between melting point and rate onset temperature and type of transfer into the gas phase are summarized. The difference between melting point of the composition and rate onset temperature of the first organic aromatic matrix compound is calculated by subtracting the rate onset, temperature from the melting point.

TABLE 3

Physical properties of first organic aromatic matrix compounds

| Referred to as: | Structure | molecular weight [g/mol] | mp [° C.] | Tg [° C.] | Rate onset temperature [° C.] | Temperature at which 0.5% weight loss occurs [° C.] |
|---|---|---|---|---|---|---|
| MX9 | 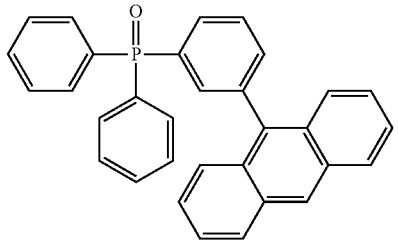 [SMILES: O=P(c1ccccc1)(c1ccccc1)c1cccc(-c2c3ccccc3cc3ccccc23)c1] | 454.5 | 122 | 66 | 164 | 313 |

TABLE 3-continued

Physical properties of first organic aromatic matrix compounds

| Referred to as: | Structure | molecular weight [g/mol] | mp [° C.] | Tg [° C.] | Rate onset temperature [° C.] | Temperature at which 0.5% weight loss occurs [° C.] |
|---|---|---|---|---|---|---|
| MX10 | | 478.52 | 208 | 82 | 202 | 348 |
| MX11 | | 478.52 | 198 | 75 | 174 | 316 |
| MX12 | | 544.58 | 263 | 105 | 235 | 395 |
| MX13 | | 544.58 | 265 | 103 | 228 | 399 |

TABLE 3-continued

Physical properties of first organic aromatic matrix compounds

| Referred to as: | Structure | molecular weight [g/mol] | mp [° C.] | Tg [° C.] | Rate onset temperature [° C.] | Temperature at which 0.5% weight loss occurs [° C.] |
| --- | --- | --- | --- | --- | --- | --- |
| MX14 | | 555.6 | 250 | 116 | 218 | 401 |
| MX15 | | 580.65 | 272 | 120 | 226 | 385 |
| MX16 | | 631.7 | 290 | 133 | 261 | 430 |
| MX1 | | 452.48 | 330 | 122 | 197 | 316 |

TABLE 3-continued

Physical properties of first organic aromatic matrix compounds

| Referred to as: | Structure | molecular weight [g/mol] | mp [° C.] | Tg [° C.] | Rate onset temperature [° C.] | Temperature at which 0.5% weight loss occurs [° C.] |
|---|---|---|---|---|---|---|
| MX2 | | 454.5 | 260 | 80 | 180 | 332 |
| MX3 | | 456.51 | 390 | 111 | 242 | 358 |
| MX4 | | 482.55 | 385 | — | 240 | 364 |
| MX5 | | 530.59 | 282 | 95 | 211 | 352 |
| MX6 | | 530.59 | 296 | 112 | 227 | 363 |

TABLE 3-continued

Physical properties of first organic aromatic matrix compounds

| Referred to as: | Structure | molecular weight [g/mol] | mp [° C.] | Tg [° C.] | Rate onset temperature [° C.] | Temperature at which 0.5% weight loss occurs [° C.] |
|---|---|---|---|---|---|---|
| MX7 | | 606.69 | 350 | 130 | 231 | 405 |
| MX8 | | 698.85 | 350 | 171 | 272 | — |

TABLE 4

Physical properties of compositions consisting of a first organic aromatic matrix compound and a first alkali organic complex

| | Matrix compound | Weight percent matrix compound in composition [wt.-%] | Alkali organic complex | Weight percent alkali organic complex in composition [wt.-%] | Melting point of composition [° C.] | Rate onset temperature of matrix compound [° C.] | Difference between melting point of composition and rate onset temperature of matrix compound | Transfer of composition into the gas phase |
|---|---|---|---|---|---|---|---|---|
| Comparative example 1 | MX13 | 70 | LI-3 | 30 | 150 | 228 | −78 | Evaporation |
| Comparative example 2 | MX10 | 50 | LI-3 | 50 | 173 | 202 | −29 | Evaporation |
| Comparative example 3 | MX12 | 75 | LI-3 | 25 | 215 | 235 | −20 | Evaporation |
| Comparative example 4 | MX16 | 50 | LI-3 | 50 | 251 | 261 | −10 | Evaporation |
| Comparative example 5 | MX11 | 70 | LI-3 | 30 | 169 | 174 | −5 | Evaporation |
| Comparative example 6 | MX14 | 70 | LI-3 | 30 | 218 | 218 | 0 | Evaporation |
| Example 1 | MX6 | 70 | LI-3 | 30 | 237 | 227 | 10 | Sublimation |
| Example 2 | MX5 | 70 | LI-3 | 30 | 233 | 211 | 22 | Sublimation |
| Example 3 | MX3 | 70 | LI-3 | 30 | 269 | 242 | 27 | Sublimation |
| Example 4 | MX2 | 70 | LI-3 | 30 | 210 | 180 | 30 | Sublimation |
| Example 5 | MX4 | 70 | LI-3 | 30 | 296 | 240 | 56 | Sublimation |
| Example 6 | MX1 | 80 | LI-3 | 20 | 259 | 197 | 62 | Sublimation |
| Example 7 | MX7 | 70 | LI-3 | 30 | 296 | 231 | 65 | Sublimation |
| Example 8 | MX8 | 50 | LiQ | 50 | 331 | 272 | 59 | Sublimation |

In comparative examples 1 to 6, the difference between melting point of the composition and rate onset temperature of the first organic aromatic matrix compound is ≤0. This means that the composition melts first before transfer into the gas phase occurs at a measurable rate. Therefore, transfer into the gas phase is via evaporation of the melted composition.

In examples 1 to 8, the difference between melting point of the composition and rate onset temperature of the first organic aromatic matrix compound is >0. Transfer of the composition into the gas phase takes place before the composition melts. In other words, the composition sublimes.

In Table 5, the change in concentration of the first alkali organic complex in the organic semiconductor layer is shown as the amount of composition left in the VTE source decreases over time. The composition of comparative example 6 and example 6 can be seen in Table 4. As can be seen in Table 5, in comparative example 6 the concentration of first alkali organic complex in the organic semiconductor layer rapidly decreases over time. When 51% of the composition has been evaporated from a single VTE source, the concentration of first alkali organic complex in the organic semiconductor layer has decreased by 27%.

In example 6, there is a small increase in concentration of first alkali organic complex over time. When 50% of the composition has been sublimed, the concentration of first alkali organic complex in the organic semiconductor layer has increased by 13%.

In conclusion, much better reproducibility over time of the organic semiconductor layer is achieved when the composition is sublimed from a single VTE source.

TABLE 5

Normalized concentration of first alkali organic complex over time in the organic semi-conductor layer

| | Amount of composition left in single VTE source [%] | Normalised concentration of first alkali organic complex in organic semi-conductor layer [%] | Change in normalised concentration of first alkali organic complex over time [%] |
|---|---|---|---|
| Comparative example 6 | 93 | 100 | 0 |
| | 80 | 83 | −17 |
| | 65 | 80 | −20 |
| | 49 | 73 | −27 |
| Example 6 | 86 | 100 | 0 |
| | 72 | 106 | 6 |
| | 50 | 113 | 13 |

Performance of top emission OLEDs comprising an organic semiconductor layer which is formed by subliming the first organic aromatic matrix compound from a first VTE source and the first alkali organic complex from a second VTE source is shown in Table 6. The phosphepine oxide group containing compound MX1 is used as first organic aromatic matrix compound and the lithium borate compound LI-3 is used as first alkali organic complex. The composition of the deposited organic semiconductor layer is 80 wt.-% MX1 and 20 wt.-% LI-3. Seven OLEDs are prepared in sequence without breaking the vacuum in between. The standard deviation for voltage is 0.03 V, for efficiency is 0.21 cd/A, for power efficiency is 0.14 lm/W and for CIE-y is 0.001.

Performance of top emission OLEDs comprising an organic semiconductor layer which is formed by subliming a composition comprising a first organic aromatic matrix compound and a first alkali organic complex from a single VTE source is shown in Table 7. The same compounds are used as above. The composition is the same as in example 6 (see Table 4). Five OLEDs are prepared in sequence without breaking the vacuum in between. The standard deviation for voltage is 0.03 V, for efficiency is 0.2 cd/A, for power efficiency is 0.16 lm/W and for CIE-y is 0.001.

In conclusion, excellent reproducibility over time has been achieved for an organic semiconductor layer comprising a composition which has been sublimed from a single VTE source.

From the foregoing detailed description, claims and examples, it will be evident that modifications and variations can be made to the compositions and methods of the invention without departing from the spirit and scope of the invention. Therefore, it is intended that all modifications made to the invention without departing from the spirit and scope of the invention come within the scope of the appended claims.

TABLE 6

Performance of top emission OLEDs comprising an organic semiconductor layer which is formed by subliming the first organic aromatic matrix compound from a first VTE source and the first alkali organic complex from a second VTE source

| OLED sequence | Voltage [V] | Efficiency [cd/A] | Power efficiency [lm/W] | CIE-y |
|---|---|---|---|---|
| OLED_1 | 3.9 | 7.8 | 6.7 | 0.052 |
| OLED_2 | 3.9 | 7.8 | 6.7 | 0.052 |
| OLED_3 | 3.9 | 8.2 | 6.8 | 0.054 |
| OLED_4 | 3.9 | 8.0 | 6.3 | 0.055 |
| OLED_5 | 3.9 | 8.3 | 6.5 | 0.056 |
| OLED_6 | 3.9 | 7.7 | 6.5 | 0.052 |
| OLED_7 | 3.9 | 7.9 | 6.7 | 0.053 |

TABLE 7

Performance of top emission OLEDs comprising an organic semiconductor layer which is formed by subliming a composition comprising a first organic aromatic matrix compound and a first alkali organic complex from a single VTE source

| OLED sequence | Voltage [V] | Efficiency [cd/A] | Power efficiency [lm/W] | CiE-y |
|---|---|---|---|---|
| OLED_1 | 3.9 | 8.0 | 6.6 | 0.053 |
| OLED_2 | 3.9 | 8.2 | 6.8 | 0.054 |
| OLED_3 | 3.9 | 8.2 | 6.5 | 0.055 |
| OLED_4 | 3.9 | 8.1 | 6.3 | 0.056 |
| OLED_5 | 3.9 | 7.7 | 6.4 | 0.053 |

The invention claimed is:

1. Method for preparing an organic semiconductor layer in a vacuum chamber at a pressure of $10^{-5}$ to $10^{-9}$ mbar comprising a step of sublimating a composition from a single vacuum thermal evaporation source arranged in the vacuum chamber, wherein the composition comprises a physical mixture of
   (a) a first organic aromatic matrix compound having a molecular weight ≥400 and ≤1,000; and
   (b) a first alkali organic complex having a molecular weight of ≥100 and ≤400.

2. Method according to claim 1, wherein the first organic aromatic matrix compound has a melting point of ≥200 and ≤450° C. and/or a glass transition temperature of ≥80 and ≤250° C.

3. Method according to claim 1, wherein the first alkali organic complex has a melting point of ≥250 and ≤450° C. and/or a glass transition temperature of ≥100 and ≤250° C.

4. Method according to claim 1, wherein a rate onset temperature for sublimating the first organic aromatic matrix compound according to claim 1 at a pressure of $10^{-5}$ to $10^{-9}$ mbar in the vacuum chamber is at least 10° C. lower than the melting point of the composition according to claim 1.

5. Method according to claim 1, wherein the first organic aromatic matrix compound is selected from the group consisting of phosphine, phosphepine, phosphine oxide, phosphepine oxide, phenanthroline, benzimidazole, benzo[k]fluoranthene, pyrene, anthracene, fluorene, spiro(bifluorene), phenanthrene, perylene, triptycene, spiro[fluorene-9,9'-xanthene], coronene, triphenylene, xanthene, benzofurane, dibenzofurane, dinaphthofurane, acridine, benzo[c]acridine, dibenzo[c,h]acridine, dibenzo[a,j]acridine, triazine, pyridine, pyrimidine, carbazole, thienopyrimidine, dithienothiophene, benzothienopyrimidine, benzothienopyrimidine, a triaryl borane compound, and derivatives thereof.

6. Method according to claim 1, wherein the first organic aromatic matrix compound has a dipole moment of >2.5 Debye and ≤10 Debye.

7. Method according to claim 1, wherein the first organic aromatic matrix compound is selected from the group consisting of phosphine oxide, phosphepine oxide, phenanthroline, benzimidazole compound, and derivatives thereof.

8. Method according to claim 1, wherein the first organic aromatic matrix compound has a dipole moment of ≥0 Debye and ≤2.5 Debye.

9. Method according to claim 8, wherein the first organic aromatic matrix compound is selected from the group consisting of benzo[k]fluoranthene, pyrene, anthracene, fluorene, spiro(bifluorene), phenanthrene, perylene, triptycene, spiro[fluorene-9,9'-xanthene], coronene, triphenylene, xanthene, benzofurane, dibenzofurane, dinaphthofurane, acridine, benzo[c]acridine, dibenzo[c,h]acridine, dibenzo[a,j]acridine, triazine, pyridine, pyrimidine, carbazole, thienopyrimidine, dithienothiophene, benzothienopyrimidine, benzothienopyrimidine, triaryl borane, phosphine, phosphepine compound, and derivatives thereof.

10. Method according to claim 1, wherein during sublimating the composition a second organic aromatic matrix compound is co-evaporated from a second vacuum thermal evaporation source.

11. Method according to claim 1, wherein the first alkali organic complex is a lithium organic complex.

12. Method according to claim 1, wherein during sublimating the composition a second alkali organic complex is co-evaporated from a second vacuum thermal evaporation source.

13. Method according to claim 1, wherein the first organic aromatic matrix compound has a melting point of ≥250 and ≤430° C. and/or a glass transition temperature of ≥90 and ≤230° C.

14. Method according to claim 1, wherein the first organic aromatic matrix compound is selected from the group consisting of phosphine oxide, phosphepine oxide, phenanthroline, and benzimidazole compound.

15. Method according to claim 11, wherein the lithium organic complex is selected from the group consisting of lithium quinolate, lithium borate, lithium phenolate, and lithium pyridinolate.

* * * * *